United States Patent
Ikedo

(10) Patent No.: US 11,089,256 B2
(45) Date of Patent: Aug. 10, 2021

(54) IMAGE SENSOR WITH CORRECTION OF DETECTION ERROR

(71) Applicant: CANON KABUSHIKI KAISHA, Tokyo (JP)

(72) Inventor: Hideki Ikedo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/929,259

(22) Filed: Jul. 15, 2020

(65) Prior Publication Data
US 2020/0351464 A1 Nov. 5, 2020

Related U.S. Application Data

(63) Continuation of application No. 16/215,789, filed on Dec. 11, 2018, now Pat. No. 10,785,439.

(30) Foreign Application Priority Data

Dec. 15, 2017 (JP) .............................. JP2017-241119

(51) Int. Cl.
*H01L 27/146* (2006.01)
*H04N 5/369* (2011.01)
(Continued)

(52) U.S. Cl.
CPC ............... *H04N 5/379* (2018.08); *G01J 1/44* (2013.01); *G01T 1/248* (2013.01);
(Continued)

(58) Field of Classification Search
CPC .... G01J 1/44; G01J 1/16; G01T 1/248; H01L 27/14643; H01L 31/107; H04N 5/37452; H04N 5/351; H04N 5/372; H04N 5/374
(Continued)

(56) References Cited

U.S. PATENT DOCUMENTS 8,716,643 B2 * 5/2014 Eldesouki ......... H01L 27/14643
250/208.1
8,816,290 B2 8/2014 Hamlin
(Continued)

FOREIGN PATENT DOCUMENTS

CN 102397049 A 4/2012
CN 104702861 A 6/2015
(Continued)

OTHER PUBLICATIONS

European Search Report dated Mar. 29, 2019, in European Patent Application No. 18211507.1.
(Continued)

*Primary Examiner* — Que Tan Le
(74) *Attorney, Agent, or Firm* — Venable LLP

(57) ABSTRACT

An image sensor comprising one or more processors and/or circuitry which functions as: a plurality of pixels each of which detects photons incident during a predetermined exposure period, counts a number of the photons, and outputs a first count value; a calculator that calculates a second count value per unit time based on the exposure period and the first count value; and a corrector that acquires a correction coefficient based on the second count value and corrects a detection error of the first count value using the correction coefficient, wherein the corrector acquires a larger value as the correction coefficient in a case where the second count value is a first value than in a case where the second count value is a second value which is smaller than the first value.

15 Claims, 19 Drawing Sheets

(51) Int. Cl.
*G01T 1/24* (2006.01)
*H04N 5/3745* (2011.01)
*G01J 1/44* (2006.01)
*H01L 31/107* (2006.01)

(52) U.S. Cl.
CPC ..... *H04N 5/37452* (2013.01); *H04N 5/37455* (2013.01); *G01J 2001/442* (2013.01); *G01J 2001/444* (2013.01); *H01L 27/14643* (2013.01); *H01L 31/107* (2013.01)

(58) Field of Classification Search
USPC .......................................... 250/208.1, 214 R
See application file for complete search history.

(56) References Cited

U.S. PATENT DOCUMENTS

| | | | |
|---|---|---|---|
| 9,210,350 | B2 | 12/2015 | Dai et al. |
| 9,431,439 | B2 | 8/2016 | Soga et al. |
| 9,596,421 | B1 | 3/2017 | Itzler |
| 9,602,745 | B2 | 3/2017 | Nashihara |
| 9,750,471 | B2 | 9/2017 | Schirra et al. |
| 2003/0076431 | A1 | 4/2003 | Krymski |
| 2005/0123090 | A1 | 6/2005 | Heismann et al. |
| 2012/0057059 | A1 | 3/2012 | Eldesouki et al. |
| 2013/0114073 | A1 | 5/2013 | Namba et al. |
| 2014/0191115 | A1 | 7/2014 | Webster et al. |
| 2014/0191136 | A1 | 7/2014 | Loeliger et al. |
| 2014/0228638 | A1 | 8/2014 | Ashida et al. |
| 2015/0156387 | A1 | 6/2015 | Miyaoshi |
| 2016/0219234 | A1 | 7/2016 | Nishihara |
| 2016/0366322 | A1 | 12/2016 | Nishihara et al. |

FOREIGN PATENT DOCUMENTS

| | | |
|---|---|---|
| CN | 104838645 A | 8/2015 |
| CN | 105188547 A | 12/2015 |
| CN | 105578082 A | 5/2016 |
| CN | 107238854 A | 10/2017 |
| JP | 2014-081253 A | 5/2014 |
| JP | 5917160 B2 | 5/2016 |
| WO | 2016/194315 A1 | 12/2016 |

OTHER PUBLICATIONS

Rosario Mita et al., "High-Speed and Compact Quenching Circuit for Single-Photon Avalanche Diodes", IEEE Transactions on Instrumentation and Measurement, Mar. 1, 2008, pp. 543-547.
Search Report dated Jul. 10, 2019, in European Patent Application No. 18211507.1.
Office Action dated May 21, 2021, in Chinese Patent Application No. 201811534272.4.

* cited by examiner

IMAGE SENSOR WITH CORRECTION OF DETECTION ERROR

This is a continuation of U.S. patent application Ser. No. 16/215,789, filed Dec. 11, 2018.

BACKGROUND OF THE INVENTION

Field of the Invention

The present invention relates to an image sensor and more specifically to an image sensor for counting the number of incident photons and outputting a counted value.

Description of the Related Art

Conventionally, CCD and CMOS image sensors have been widely used in image capturing apparatuses. A common method used in these image sensors is to convert incident light during an exposure period into electric charges by photodiodes and accumulate them, read out the charges as an analog signal of current or voltage, and convert the analog signal into a digital signal.

Meanwhile, in recent years, a photon counting type image sensor which counts the number of photons incident on a photodiode during an exposure period and outputs the count value as a signal value has been proposed. As means for realizing the photon counting method, for example, there is a method of using an avalanche photodiode and a counter circuit. When a reverse bias voltage larger than the breakdown voltage is applied to the avalanche photodiode, carriers generated due to the incidence of a photon cause avalanche multiplication phenomenon and a large current is generated. By counting the pulse signal generated based on this current by a counter circuit, a signal value corresponding to the number of photons incident on the avalanche photodiode can be obtained.

In the photon counting type image sensor, the number of photons incident on the photodiode is treated as a signal value as it is. Therefore, compared to CCD and CMOS image sensors, there is little influence of a circuit noise on a signal, and thus it is possible to capture images clearly even in weak light environments.

However, in the photon counting type image sensor, as the amount of received light per unit time increases, photons are incident with a period shorter than the pulse width of the pulse signal, and a plurality of pulse signals may be combined. This causes the count value counted by the counter circuit to be smaller than an actual number of photons, and a linear signal value with respect to the received light amount cannot be obtained. That is, the linearity characteristic deteriorates. As a result, the image quality of the captured image deteriorates.

Accordingly, Japanese Patent Laid-Open No. 2014-81253 discloses a photon counting photodetector having cumulative means for obtaining an output value obtained by cumulatively adding pulse widths of a pulse signal in order to suppress a drop in the count value. With this configuration, a signal which monotonically increases with respect to an amount of received light can be obtained.

Further, Japanese Patent No. 5917160 discloses a method in which deterioration in linearity characteristics caused by incomplete transfer of charges in a CMOS image sensor is compensated for using a gain correction value and an offset correction value corresponding to an exposure amount (that is, an amount of light received during an exposure period).

However, in the configuration described in Japanese Patent Laid-Open No. 2014-81253, for example, when a plurality of photons are simultaneously incident on one avalanche photodiode, a correct signal value cannot be obtained. Therefore, the linearity with respect to the received light amount is insufficient.

Further, in the correction method described in Japanese Patent No. 5917160, the gain correction value and the offset correction value are changed according to the exposure amount. However, in the photon counting type image sensor, between the case of counting for a short time under high illuminance environment (a received light amount per unit time is large) and the case of counting for a long time under low illuminance environment (a received light amount per unit time is small), even if the exposure amounts are the same, the decreases in count value is larger in the former case. Therefore, it is insufficient to merely change the correction value in accordance with the exposure amount. Especially in low illuminance environment, overcorrection may occur and the image quality may be deteriorated.

SUMMARY OF THE INVENTION

The present invention has been made in consideration of the above situation, and suppresses deterioration of image quality caused by a difference in received light amount per unit time in an image capturing apparatus which counts the number of incident photons and outputs a count value as a signal value.

According to the present invention, provided is an image sensor comprising one or more processors and/or circuitry which functions as: a plurality of pixels each of which detects photons incident during a predetermined exposure period, counts a number of the photons, and outputs a first count value; a calculator that calculates a second count value per unit time based on the exposure period and the first count value; and a corrector that acquires a correction coefficient based on the second count value and corrects a detection error of the first count value using the correction coefficient, wherein the corrector acquires a larger value as the correction coefficient in a case where the second count value is a first value than in a case where the second count value is a second value which is smaller than the first value.

Furthermore, according to the present invention, provided is an image sensor comprising one or more processors and/or circuitry which functions as: a plurality of pixels each having a detector that detects photons, a counter that counts a number of the detected photons and outputs a counted value, and a memory that holds the counted value, and outputs the counted value held in the memory as a first count value each time a predetermined exposure period elapses; a calculator that calculates a second count value per unit time based on the exposure period and a difference value between the first count values output in sequence; and a corrector that obtains a correction coefficient based on the second count value and corrects a detection error of the difference value using the correction coefficient, wherein the corrector obtains a larger value as the correction coefficient in a case where the second count value is a first value than in a case where the second count value is a second value which is smaller than the first value.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings.

First Embodiment

Figure 1:
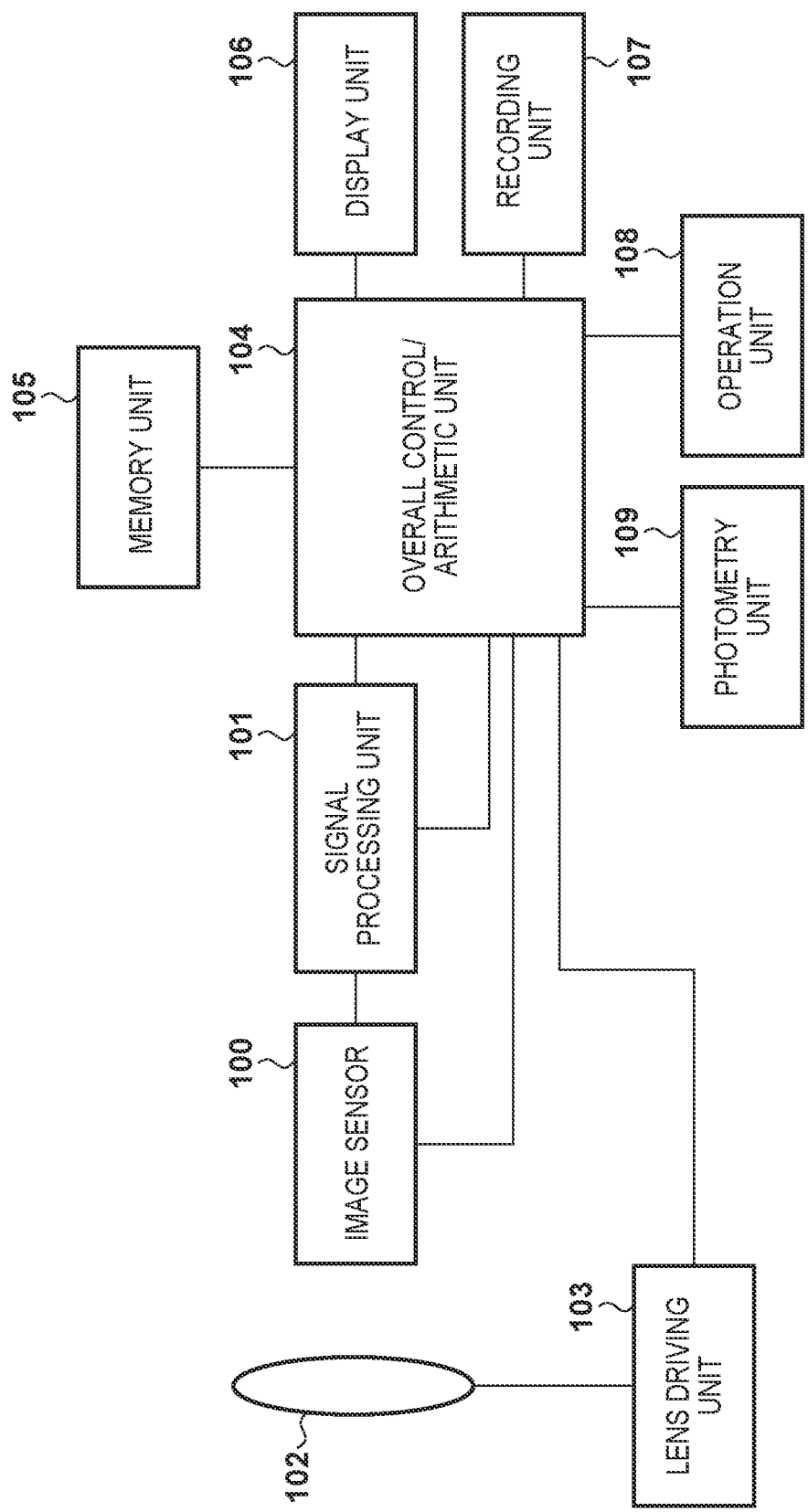
FIG. 1 is a block diagram showing an overall configuration of an image capturing apparatus according to a first embodiment of the present invention.

A first embodiment of the present invention will be described. FIG. 1 is a block diagram showing the overall configuration of an image capturing apparatus according to the first embodiment. In FIG. 1, an imaging lens 102 is driven by a lens driving unit 103, and performs zoom control, focus control, aperture control, and the like to form an optical image of a subject on an image sensor 100.

The image sensor 100 has a configuration capable of counting the number of incident photons and outputting it as a signal value, receives the optical image of the subject formed by the imaging lens 102 as incident light and outputs an image signal. The configuration of the image sensor 100 will be described later in detail. A signal processing unit 101 performs various kinds of signal processing including rearrangement on the image signal output from the image sensor 100. An overall control/arithmetic unit 104 performs various arithmetic processing and controls the entire image capturing apparatus.

A memory unit 105 is used for temporarily storing image data, and a display unit 106 displays various information and captured images. A recording unit 107 has a structure in which a semiconductor memory and the like can be attached and detached, and performs recording or reading of image data. An operation unit 108 includes buttons, dials, and the like, and receives inputs caused by operation of the operation unit 108 by the user. If the display unit 106 is a touch panel, the touch panel is also included in the operation unit 108. A photometry unit 109 includes an image sensor, such as a CCD or CMOS sensor (not shown), for photometry, receives light passing through the imaging lens 102 via a movable mirror (not shown) or the like, and calculates luminance of the subject for each of a plurality of photometry areas.

Figure 2:
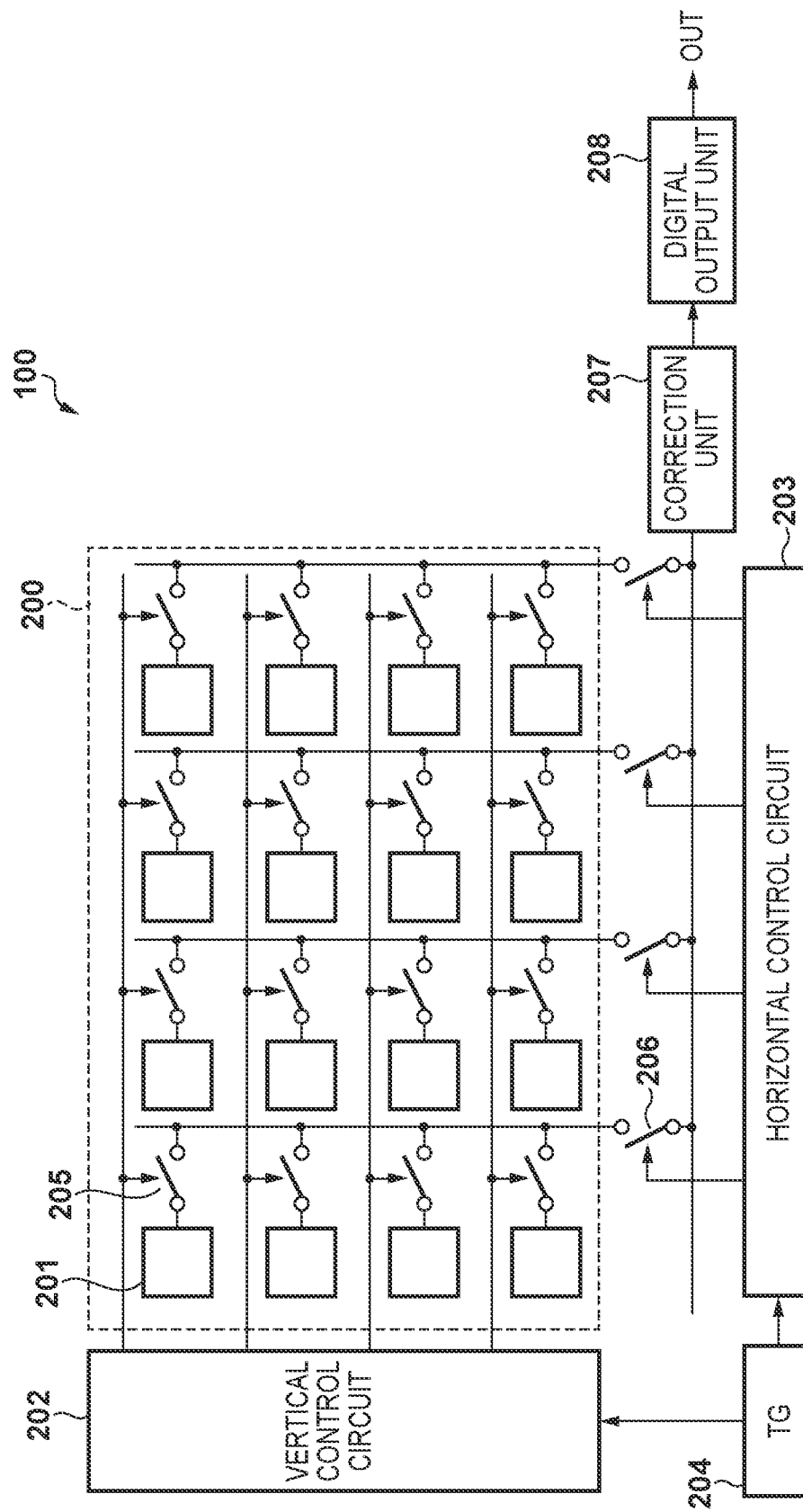
FIG. 2 is a diagram showing a configuration of an image sensor according to the first embodiment.

FIG. 2 is a diagram showing an overall configuration of the image sensor 100. The image sensor 100 includes a pixel area 200, a vertical control circuit 202, a horizontal control circuit 203, a timing generator (TG) 204, a correction unit 207, and a digital output unit 208.

In the pixel area 200, unit pixels 201 each having an avalanche photodiode and a counter circuit are arranged in a matrix as described later. Here, in order to simplify the explanation, an array of 4×4 unit pixels 201 is shown, but in practice more pixels are arranged. The unit pixel 201 can count the number of incident photons and output it as a digital signal value. Details of the unit pixel 201 will be described with reference to FIG. 3.

The vertical control circuit 202 selects the unit pixels 201 in the pixel area 200 on a row-by-row basis using switches 205. In addition, the vertical control circuit 202 sends control signals to the unit pixels 201 in the pixel area 200 on a row-by-row basis via wires (not shown). Details of this control signal will also be described later with reference to FIG. 3.

The horizontal control circuit 203 selects the unit pixels 201 in the pixel area 200 by switches 206 on a column-by-column basis. A pixel signal of the unit pixel 201 selected by the combination of the vertical control circuit 202 and the horizontal control circuit 203 is output to the correction unit 207.

The correction unit 207 performs a correction process (image processing) for suppressing deterioration in image quality caused by a difference in received light amount per unit time on the pixel signal output from each pixel unit 201. The correction unit 207 also performs a correction process of matching the black levels of the pixel signals with a reference value. Details of these correction processes will be described later with reference to FIG. 8.

The digital output unit 208 outputs the pixel signals corrected (image processed) by the correction unit 207 to the outside of the image sensor 100. The TG 204 sends control signals for outputting the pixel signal of each pixel to the vertical control circuit 202 and the horizontal control circuit 203. It should be noted that the TG 204 also sends control signals to the correction unit 207 and the digital output unit 208 via wires (not shown).

Figure 3:
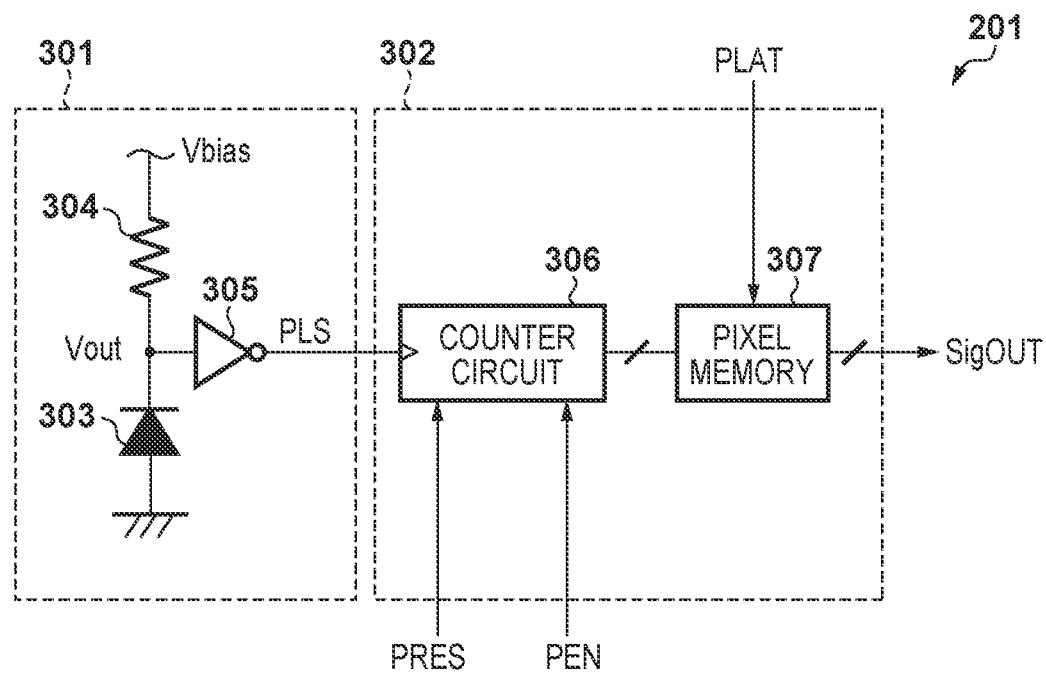
FIG. 3 is a circuit diagram showing an example of a configuration of a unit pixel according to the first embodiment.

FIG. 3 is a diagram showing a configuration of the unit pixel 201. The unit pixel 201 is roughly divided into a light receiving unit 301 and a counting unit 302.

The light receiving unit 301 includes a photodiode (PD) 303, a quenching resistor 304, and an inverting buffer 305. The PD 303 is an avalanche photodiode, and a reverse bias voltage Vbias larger than the breakdown voltage is applied through the quenching resistor 304 and operates in the Geiger mode. Therefore, when a photon enters the PD 303, an avalanche multiplication phenomenon is caused and an avalanche current is generated. The quenching resistor 304 is a resistor element for stopping the avalanche multiplication phenomenon of the PD 303. The inverting buffer 305 is provided for taking a voltage change caused by the avalanche multiplication phenomenon as a pulse signal (hereinafter referred to as "PLS signal").

Figure 4:
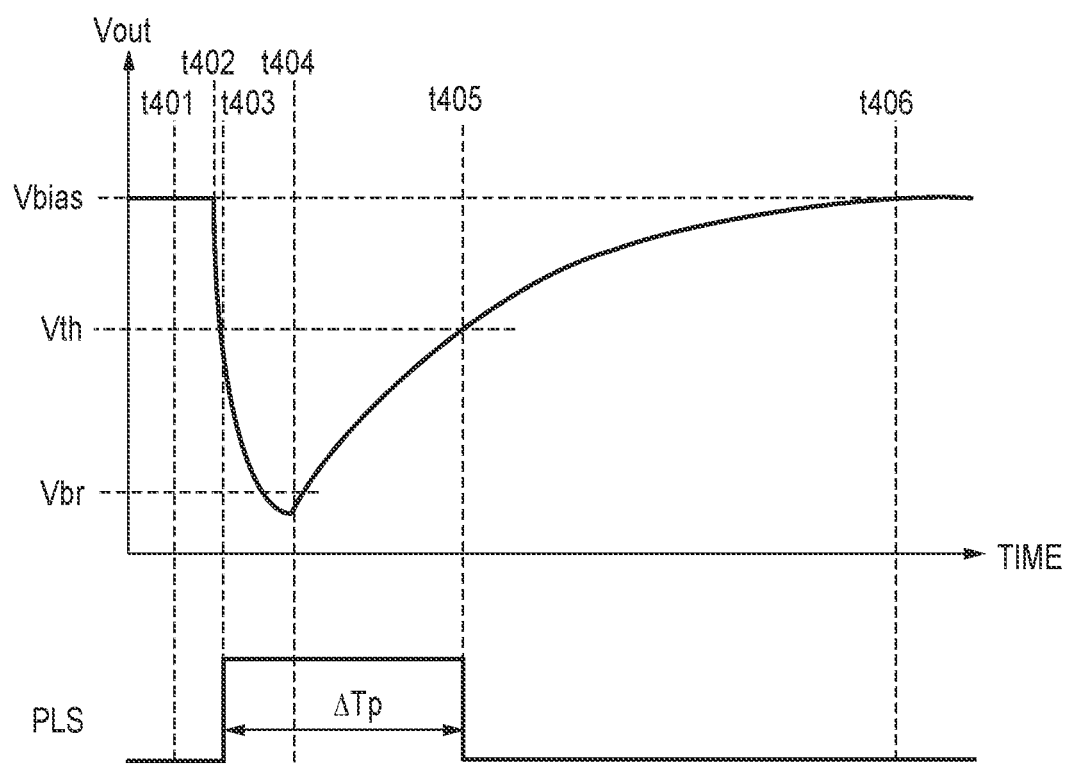
FIG. 4 is a diagram for explaining an operation of a light receiving unit according to the first embodiment.

The operation of the light receiving unit 301 will be described with reference to FIG. 4. FIG. 4 is a diagram showing transition of a cathode terminal voltage Vout and the PLS signal output from the inverting buffer 305 when photons are incident on the PD 303 with respect to time. Here, the cathode terminal voltage Vout is also the magnitude of the reverse bias voltage applied to the PD 303.

At time t401, the reverse bias voltage Vbias larger than a breakdown voltage Vbr is applied to the PD 303 and the PD 303 operates in the Geiger mode. In this state, when a photon enters the PD 303 at time t402, carriers generated by the PD 303 cause an avalanche multiplication phenomenon, and an avalanche current is generated. Due to this avalanche current, the cathode terminal voltage Vout of the PD 303 connected to the quenching resistor 304 starts to decrease. When the cathode terminal voltage Vout falls below the breakdown voltage Vbr at time t404, the avalanche multiplication phenomenon stops. Then, the cathode terminal voltage Vout starts to rise as it is recharged by a power source to which the reverse bias voltage Vbias is applied via the quenching resistor 304. When recharging is completed at time t406, the cathode terminal voltage Vout returns to the reverse bias voltage Vbias again. Here, the time required to recharge the cathode terminal voltage Vout depends on a resistance value of the quenching resistor 304 and a parasitic capacitance.

Assuming that a threshold value at which the PLS signal output from the inverting buffer 305 switches from L to H and from H to L is Vth, the PLS signal becomes H between times t403 and t405 as shown in FIG. 4. Therefore, one PLS signal is output from the light receiving unit 301 by one photon incidence. Here, a pulse width of the PLS signal generated at times t403 to t405 is denoted by ΔTp.

Returning to the description of FIG. 3, the counting unit 302 includes a counter circuit 306 and a pixel memory 307. To the counter circuit 306, the PLS signal generated in response to the incidence of photons by the light receiving unit 301 is input, and the number of times that the PLS signal changes from L to H is counted as the number of pulses. An enable signal (hereinafter referred to as "PEN signal") and a reset signal (hereinafter referred to as "PRES signal") are supplied from the vertical control circuit 202 to the counter circuit 306. When the PLS signal changes from L to H while the PEN signal supplied to the counter circuit 306 is at the H level, the count value increases by one. In the state where the PEN signal is at the L level, even when the PLS signal changes from L to H, the count value does not increase and the current count value is retained. When the PRES signal supplied to the counter circuit 306 becomes the H level, the count value of the counter circuit 306 is reset to 0.

The pixel memory 307 is used for temporarily holding a count value counted by the counter circuit 306 as a digital pixel signal while pixel signals are read out to the correction unit 207. A latch signal (hereinafter referred to as "PLAT signal") is supplied from the vertical control circuit 202 to the pixel memory 307. When the PLAT signal changes from L to H, the pixel memory 307 captures and holds the count value of the counter circuit 306 at that time as a digital pixel signal. Thereafter, the value counted by the counter circuit 306 is referred to as the count value, and the value held by the pixel memory 307 is referred to as a pixel signal in order to distinguish between these signals.

The pixel signal held in the pixel memory 307 of the unit pixel 201 selected by the combination of the vertical control circuit 202 and the horizontal control circuit 203 is output to the correction unit 207.

In the first embodiment, the PEN signal, the PRES signal, and the PLAT signal supplied from the vertical control circuit 202 are described as being controlled simultaneously for all the unit pixels 201 in the pixel area 200, however, the timing of controlling the unit pixels 201 by these signals may be controlled on a row-by-row basis.

Figure 5:
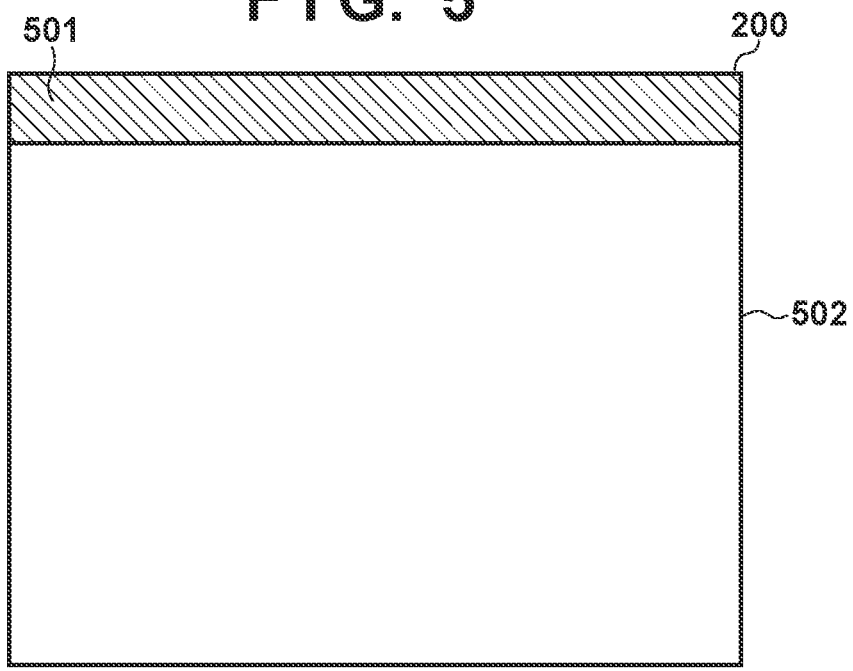
FIG. 5 is a schematic diagram showing a configuration of a pixel area according to the first embodiment.

As shown in FIG. 5, a partial area of the pixel area 200 is composed of an optical black pixel area (hereinafter referred to as "OB area") 501 and an open pixel region 502. The light receiving unit 301 of the unit pixel 201 (OB pixel) arranged in the OB area 501 is shielded by a metal light shielding layer or the like (not shown), and light is not incident on the PD 303. The pixel signal output from each unit pixel 201 in the OB area 501 is used for correction to adjust the black level of the pixel signal to the reference value by the correction unit 207. On the other hand, the light receiving unit 301 of the unit pixel 201 arranged in the open pixel region 502 has an aperture (not shown) so that light enters the PD 303. From each unit pixel 201 in the open pixel region 502, a pixel signal corresponding to the received light amount is output.

In FIG. 5, the OB area 501 is arranged in the upper side of the pixel area 200, however, the position of the OB area 501 may be arbitrarily selected, such as the left side and the right side of the pixel area 200.

Figure 6:
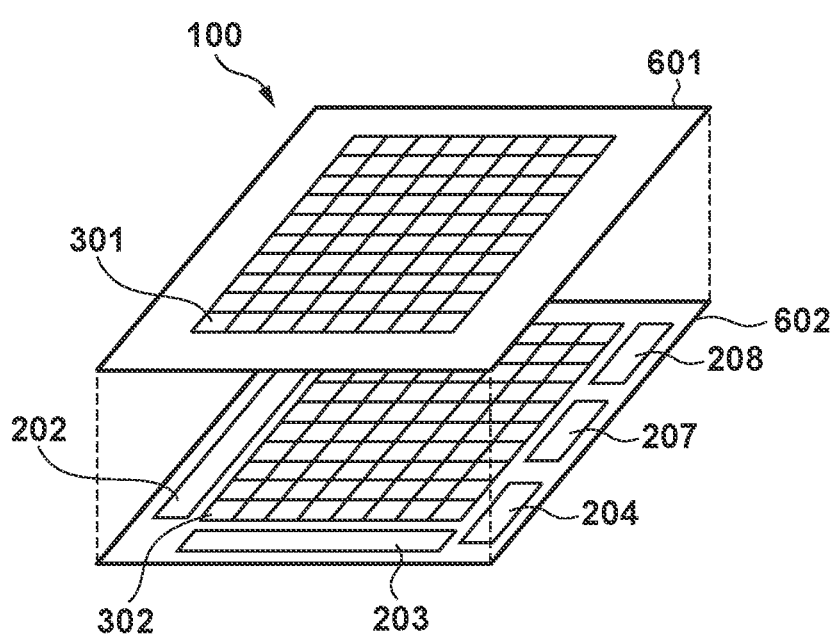
FIG. 6 is a schematic diagram showing an example of a chip layout of the image sensor according to the first embodiment.

FIG. 6 shows an example of a chip layout of the image sensor 100. The image sensor 100 has a structure in which a light receiving unit substrate 601 and a counting unit substrate 602 are stacked. Wirings of these substrates are electrically connected by using silicon penetrating electrodes or the like. In the light receiving unit substrate 601, the light receiving units 301 of the unit pixels 201 are arranged in a matrix. In the counting unit substrate 602, the counting units 302 of the unit pixels 201 are arranged in a matrix. In addition, the vertical control circuit 202, the horizontal control circuit 203, the TG 204, the correction unit 207, and the digital output unit 208 are also arranged on the counting unit substrate 602. As shown in FIG. 5, by forming the light receiving unit 301 and the counting unit 302 on separate substrates, the area of the light receiving unit 301 can be secured, whereby a decrease in aperture ratio of the light receiving unit 301 can be prevented. Note that the image sensor 100 may be formed on a single substrate instead of forming on the stacked substrates.

Figure 7:
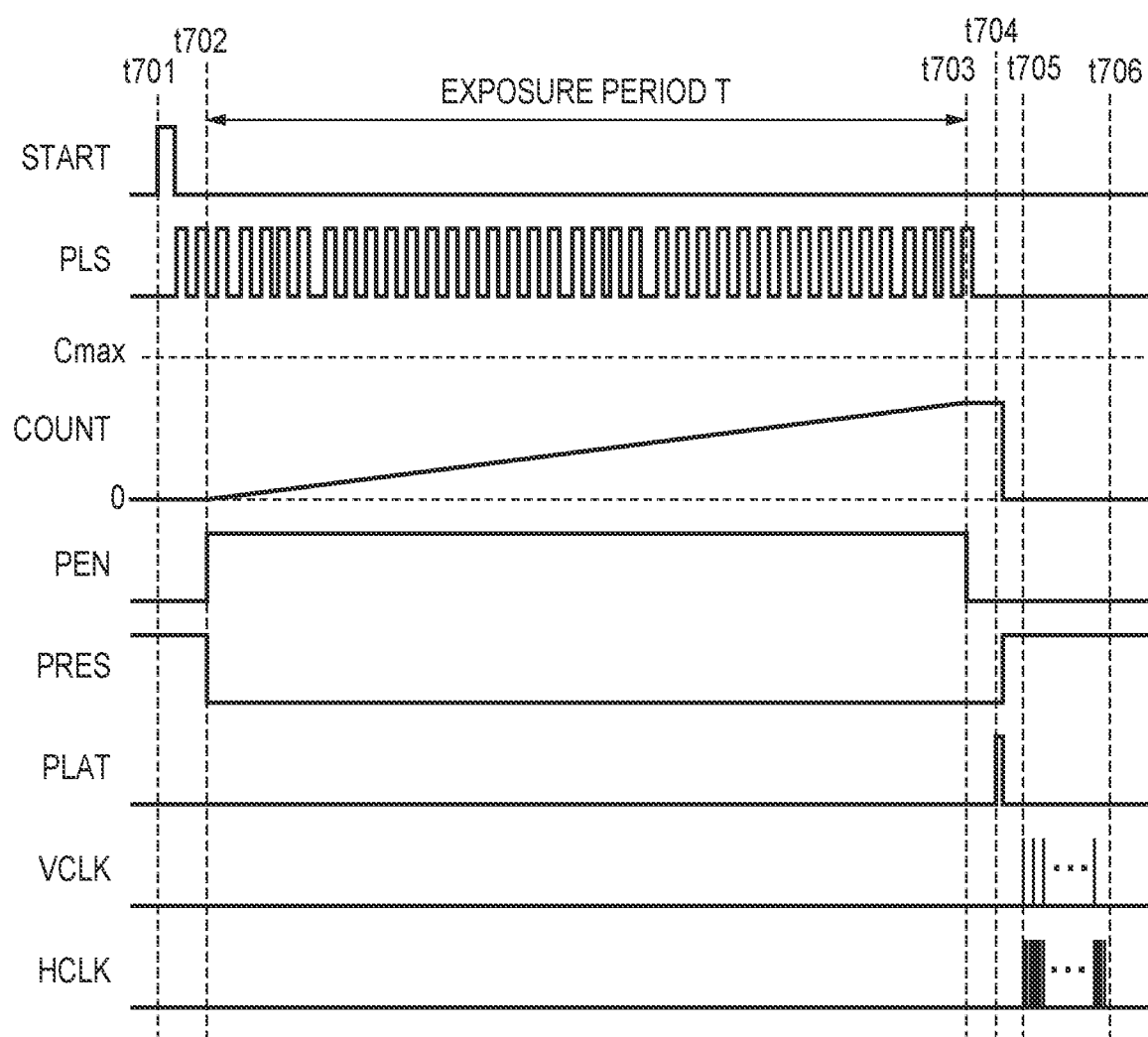
FIG. 7 is a drive timing chart of the image capturing apparatus when an image of one frame is captured according to the first embodiment.

FIG. 7 is a drive timing chart of the image capturing apparatus when obtaining an image of one frame in the first embodiment. When a shooting start signal START changes from L to H at time t701, the reverse bias voltage Vbias is supplied to the light receiving unit 301 of each unit pixel 201. Then, a reverse bias voltage larger than the breakdown voltage is applied to the PD 303, and the PD 303 starts to operate in the Geiger mode. As a result, the PLS signal corresponding to the number of incident photons is output from the light receiving unit 301. COUNT shows an example of the count value counted by the counter circuit 306 of an arbitrary unit pixel 201. Cmax is the maximum value that can be counted by the counter circuit 306.

At the time t701, the PRES signal is H, and the count value of the counter circuit 306 of each unit pixel 201 is reset to 0.

At time t702, the PRES signal becomes L, and resetting of the counter circuit 306 of each unit pixel 201 ends. At the same time, the PEN signal becomes H, and the counter circuit 306 of each unit pixel 201 is enabled. Therefore, in the counter circuit 306 of each unit pixel 201, the count value increases in accordance with the input PLS signal. Accordingly, the exposure period of the image capturing apparatus starts. This exposure period continues until the PEN signal goes to L at time t703. T denotes the length of the exposure period from time t702 to time t703.

When the exposure period T ends at time t703, the PEN signal becomes L. As a result, the counter circuit 306 of each unit pixel 201 is disabled, and even if the PLS signal is input to the counter circuit 306, the count value does not increase. Also, the supply of the reverse bias voltage Vbias to the light receiving unit 301 is stopped, and the light receiving unit 301 stops outputting the PLS signal. Then, at time t704, the PLAT signal supplied to each unit pixel 201 from the vertical control circuit 202 simultaneously changes from L to H. As a result, the count value of the counter circuit 306 of each unit pixel 201 is held in the pixel memory 307 as a pixel signal. After that, the PLAT signal returns to L. Further, when the pixel signal is held in the pixel memory 307, the PRES signal goes to H immediately, and the count value of the counter circuit 306 of each unit pixel 201 is reset to 0.

During times t705 to t706, a VCLK signal is supplied from the TG 204 to the vertical control circuit 202. Each time the VCLK signal goes to H, the switches 205 in each row turn on in turn and the vertical control circuit 202 selects the unit pixels 201 in the pixel area 200 row by row. When an arbitrary row is selected, an HCLK signal is supplied from the TG 204 to the horizontal control circuit 203, and the switches 206 in each column are sequentially turned on. As a result, the pixel signals held in the pixel memory 307 of the unit pixels 201 of the selected row are sequentially output to the correction unit 207.

Thereafter, the pixel signals corrected by the correction unit 207 are sequentially output to the outside of the image sensor 100 via the digital output unit 208.

Figure 8:
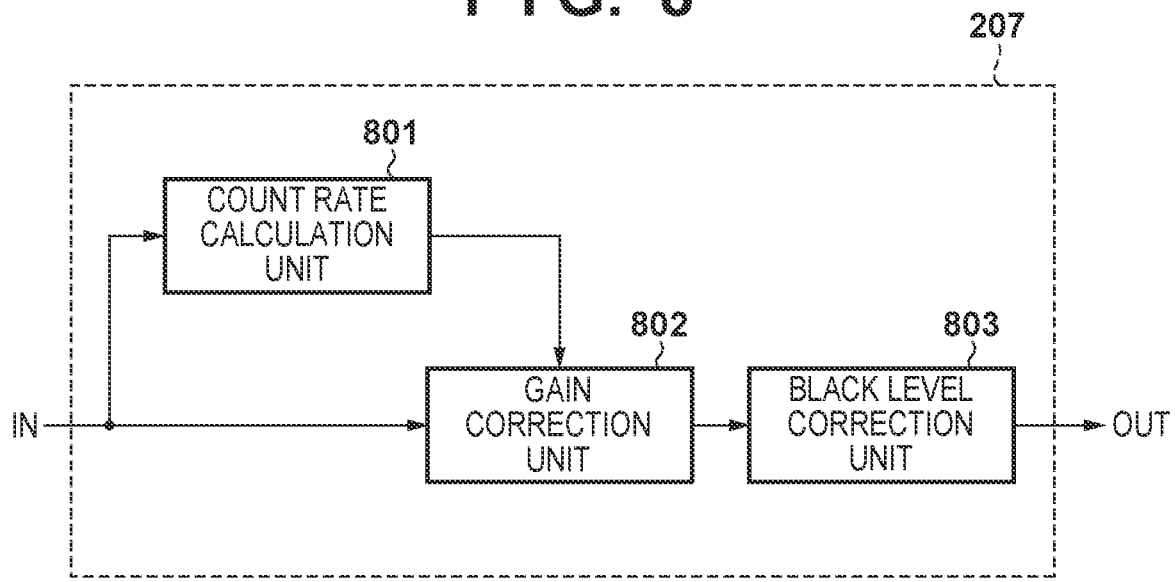
FIG. 8 is a block diagram illustrating a configuration of a correction unit according to the first embodiment.

FIG. 8 shows a configuration of the correction unit 207. The correction unit 207 includes a count rate calculation unit 801, a gain correction unit 802, and a black level correction unit 803. The count rate calculation unit 801 and the gain correction unit 802 correct image quality deterioration caused by a difference in received light amount per unit time. The black level correction unit 803 removes the pixel signal component (dark current component) that is inappropriately increased since the counter circuit 306 has counted the PLS signal output from the light receiving unit 301 corresponding to the dark current generated in the PD 303 of each unit pixel 201 by performing offset correction.

Here, a method of correcting image quality deterioration (error) caused by a difference in received light amount per unit time will be described with reference to FIGS. 9 and 10.

Figure 9:
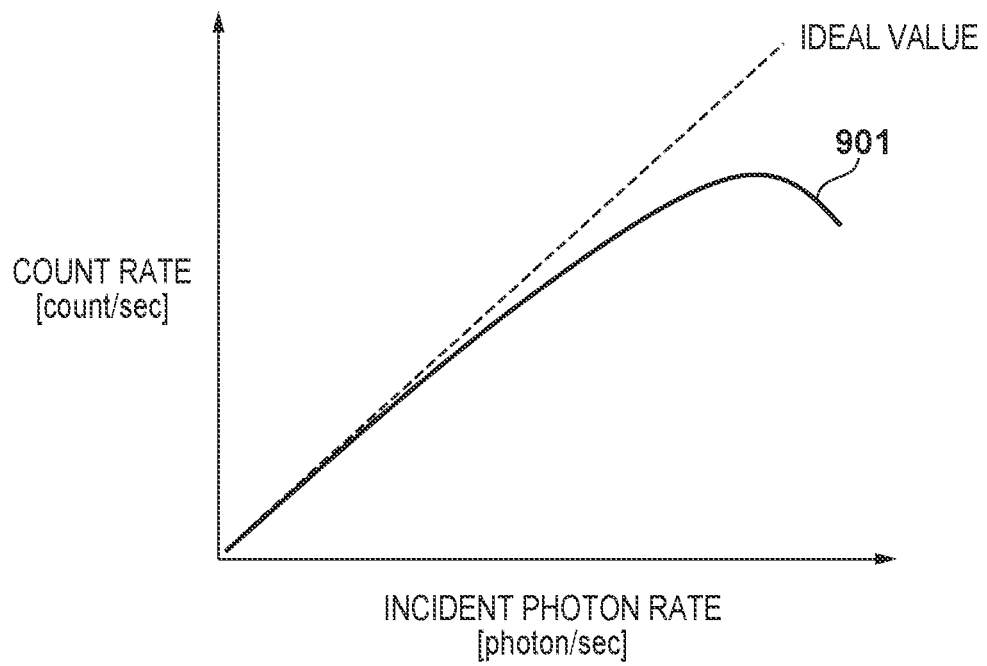
FIG. 9 is a diagram showing a relationship between a count rate and an incident photon rate.

FIG. 9 shows the relationship between an incident photon rate of an arbitrary unit pixel 201 and a count rate of the counter circuit 306. Here, the incident photon rate is the number of photons incident on the light receiving unit 301 per unit time, which is proportional to the received light amount per unit time. The count rate is an increment per unit time of the count value of the counter circuit 306. Ideally, the count rate and the incident photon rate are proportional as shown by the ideal value. However, in a state where the incident photon rate is high, that is, in a state in which the amount of received light per unit time is large, a new photon is incident before the PLS signal generated by the incidence of one photon returns from H to L. As a result, a plurality of PLS signals are connected, and the count value counted by the counter circuit 306 becomes lower than the actual number of photons. Therefore, as the incident photon rate increases, the count rate becomes lower than the actual value, as shown by 901 in FIG. 9.

Figure 10:
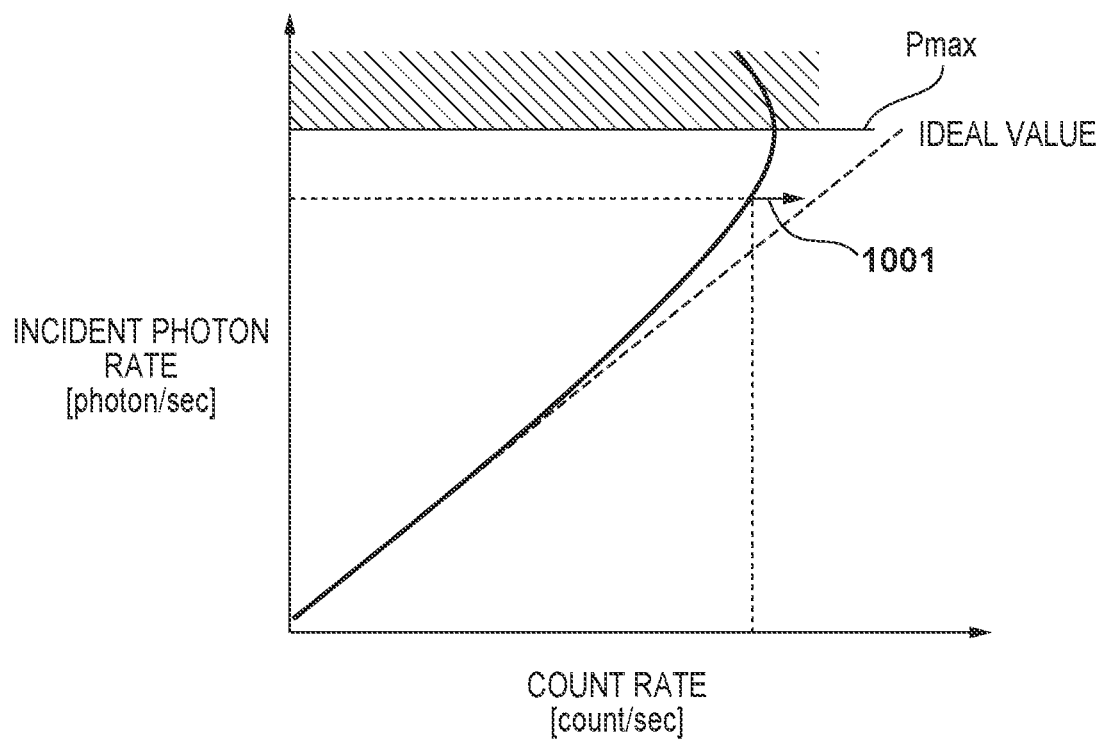
FIG. 10 is a diagram showing a relationship between an incident photon rate and a count rate.

FIG. 10 shows the relationship between the incident photon rate and the count rate. FIG. 10 shows a graph in which the vertical axis and the horizontal axis of the graph of FIG. 9 are exchanged. As shown in FIG. 10, it is possible to obtain a pixel signal that is linear with respect to the amount of received light by performing gain correction on the pixel signal so that the pixel signal becomes an ideal value as indicated by an arrow 1001 in accordance with the count rate of each unit pixel 201. Here, in the area indicated by slanted lines where the incident photon rate is Pmax or more, the count rate starts to decrease as the incident photon rate increases. Therefore, in a case where the incident photon rate is Pmax or more, the true incident photon rate cannot be calculated from the count rate. For this reason, photometry processing is performed with the photometry unit 109 before image shooting, and if the overall control/arithmetic unit 104 determines from the photometry result that a high-luminance subject whose incident photon rate is greater than or equal to Pmax exists in the scene, image shooting is performed after controlling the aperture of the imaging lens 102 so that the incident photon rate becomes less than Pmax. Alternatively, as described in Japanese Patent Laid-Open No. 2014-81253, accumulation means for cumulatively adding the pulse width of the PLS signal output from the light receiving portion may be provided in each pixel so that a signal monotonically increasing with respect to the amount of received light is output from each pixel.

Next, specific processing of each block in FIG. 8 will be described. In the count rate calculation unit 801, the pixel signals output from the unit pixels 201 are sequentially input. Then, by dividing the pixel signal by the exposure period T, the count rate which is the increment of the count value per unit time is calculated.

The gain correction unit 802 performs gain correction on the pixel signal from the unit pixel 201 to be corrected based on the count rate calculated by the count rate calculation unit 801. Let x be the pixel signal output from each unit pixel 201 and input to the correction unit 207 and let y the pixel signal after gain correction, then the pixel signal y after gain correction can be expressed by Equation (1).

$$y = \alpha(r) \times x \tag{1}$$

Here, $\alpha(r)$ is a gain correction coefficient, r is the count rate calculated in the count rate calculation unit 801.

Figure 11:
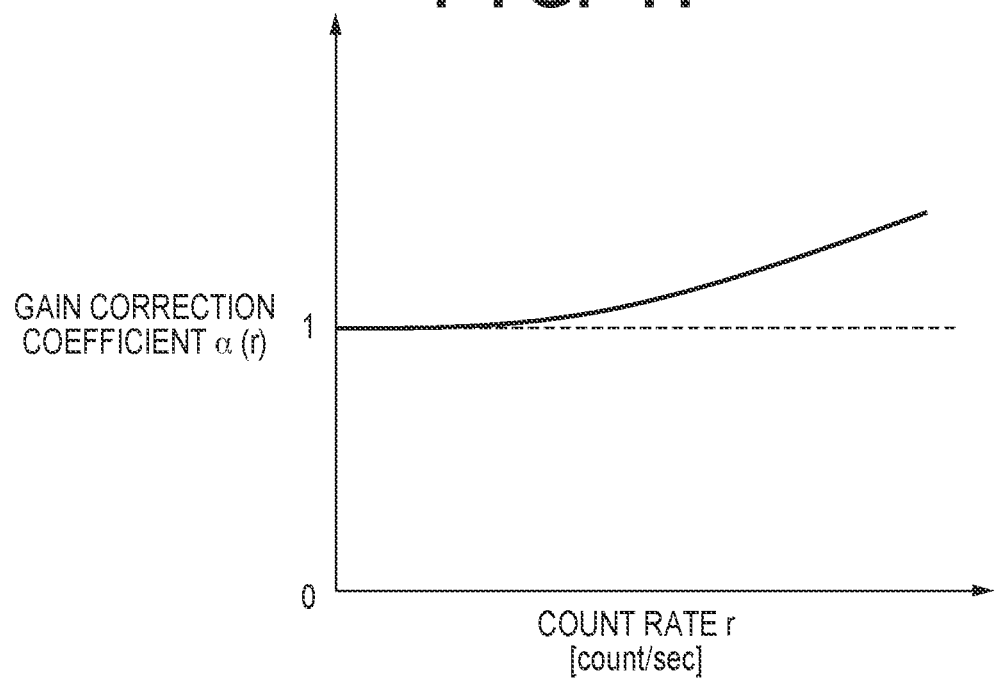
FIG. 11 is a diagram showing an example of a gain correction coefficient according to the first embodiment.

FIG. 11 shows an example of the gain correction coefficient $\alpha(r)$. As shown in the FIG. 11, the gain correction coefficient α(r) takes different values depending on the count rater calculated by the count rate calculation unit 801. The gain correction coefficient α(r) is a gain correction amount necessary for making the count rate in FIG. 10 an ideal value.

The gain correction coefficients α(r) may be stored as a correction table corresponding to count rates r in the gain correction unit 802. Alternatively, an function of count rate r for approximating the gain correction coefficient α(r) may be stored, and the gain correction coefficient α(r) may be calculated according to the count rate of each unit pixel 201.

The black level correction unit 803 receives the pixel signal gain-corrected by the gain correction unit 802, and removes the dark current component from the pixel signal by performing offset correction. Specifically, the dark current component is calculated by integrating the pixel signals of the OB area 501, and calculating the average value. Then, the average value is subtracted from the pixel signal of each unit pixel 201 in the open pixel region 502, thereby removing the dark current component.

The pixel signals corrected by the black level correction unit 803 are sequentially sent to the digital output unit 208 and output to the outside of the image sensor 100.

The gain correction by the gain correction unit 802 is performed before the offset correction by the black level correction unit 803. This is because the pulse signal caused by the dark current in the light receiving unit 301 and the pulse signal generated by the incidence of the photon are connected, and therefore, both the pixel signal component due to the photons and the dark current component of the count value counted by the counter circuit 306 become smaller than the correct values. Therefore, in the gain correction unit 802, gain correction is performed so that the pixel signal component corresponding to the actual number of incident photons and the dark current component of the count value are obtained, and then the average pixel signal of the OB area 501 is subtracted from each pixel signal by the black level correction unit 803, thereby suitably removing the dark current component.

Note that if the dark current component is sufficiently smaller than the pixel signal component corresponding to the photons, the gain correction unit 802 may perform the gain correction after the offset correction is performed by the black level correction unit 803.

Thus, by performing the correction processes in the correction unit 207 as described above, image quality deterioration caused by a difference in received light amount per unit time can be suppressed. Note that it is possible to modify the configuration such that the correction processes performed in the correction unit 207 may be performed in the signal processing unit 101 or the overall control/arithmetic unit 104.

Modification

Figure 12:
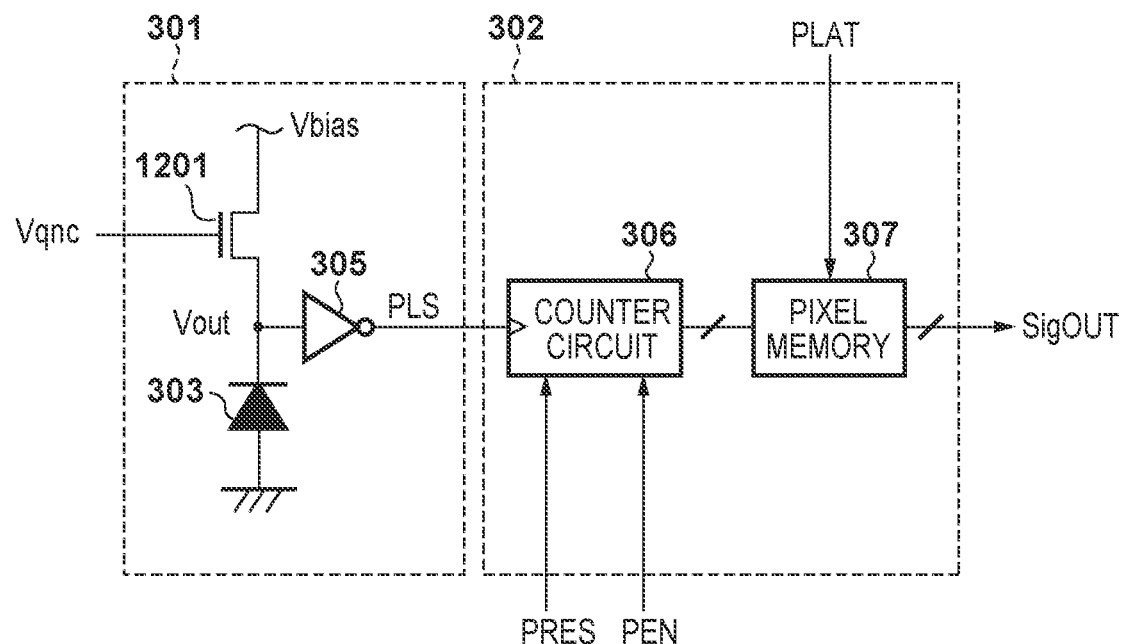
FIG. 12 is a circuit diagram showing an example of a configuration of a unit pixel according to a modification of the first embodiment.

In the unit pixel 201 shown in FIG. 3, the avalanche multiplication is stopped by using the quenching resistor 304. Alternatively, a resistance component of the MOS transistor may be used as the quenching resistance. FIG. 12 shows a configuration of a unit pixel 201 according to a modification of the first embodiment. FIG. 12 shows a configuration of the unit pixel 201 corresponding to the configuration shown in FIG. 3, and the same reference numerals as in FIG. 3 are given to the same constituents and description thereof is omitted.

FIG. 12 shows the configuration when the resistance component between the drain and the source of a MOS transistor 1201 is utilized as a quench resistance. In this configuration, the time required for recharging between times t404 to t406 in FIG. 4 can be changed by changing the resistance value between the drain and the source by changing a gate voltage Vqnc of the MOS transistor 1201. For example, when the MOS transistor 1201 is turned on by making the gate voltage Vqnc equal to or higher than the gate threshold voltage, the resistance value between the drain and the source decreases. As a result, the time required for recharging is shortened, and a pulse width ΔTp of the PLS signal is shortened. Therefore, when a plurality of photons are successively incident on the light receiving portion, it is possible to reduce the probability that pulses generated by the respective photons are connected.

As a result, it is possible to reduce the decrease of the output count rate in a case where the incident photon rate shown in FIG. 9 is high. In this case, by changing the gain correction coefficient α(r) to be multiplied to the pixel signal by the gain correction unit 802 in accordance with the pulse width ΔTp, excessive correction can be suppressed. Therefore, image quality deterioration caused by a difference in received light amount per unit time can be suitably suppressed.

Second Embodiment

Next, a second embodiment of the present invention will be described. In the first embodiment described above, the count rate is calculated for each pixel and correction is performed using the gain correction coefficient corresponding to the count rate. On the other hand, in the second embodiment, a gain correction coefficient corresponding to a pixel signal is selected based on a photometry result of the photometry unit 109.

Figure 13:
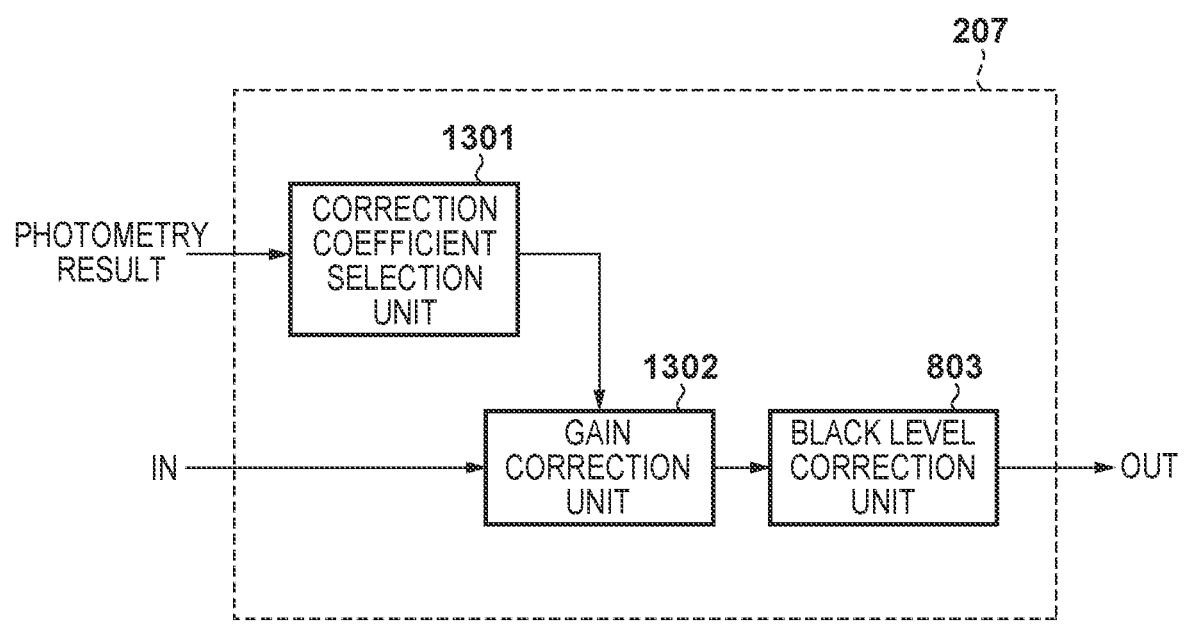
FIG. 13 is a block diagram illustrating a configuration of a correction unit according to a second embodiment.

FIG. 13 is a block diagram showing a configuration of the correction unit 207 in the second embodiment, which is used in place of the correction unit 207 shown in FIG. 8 described in the first embodiment. It is to be noted that the same reference numerals are given to the same configurations as those in FIG. 8, and a description thereof will be omitted. In addition, since the configuration other than the correction unit 207 is the same as that of the first embodiment described above, description thereof is omitted.

Figure 14:
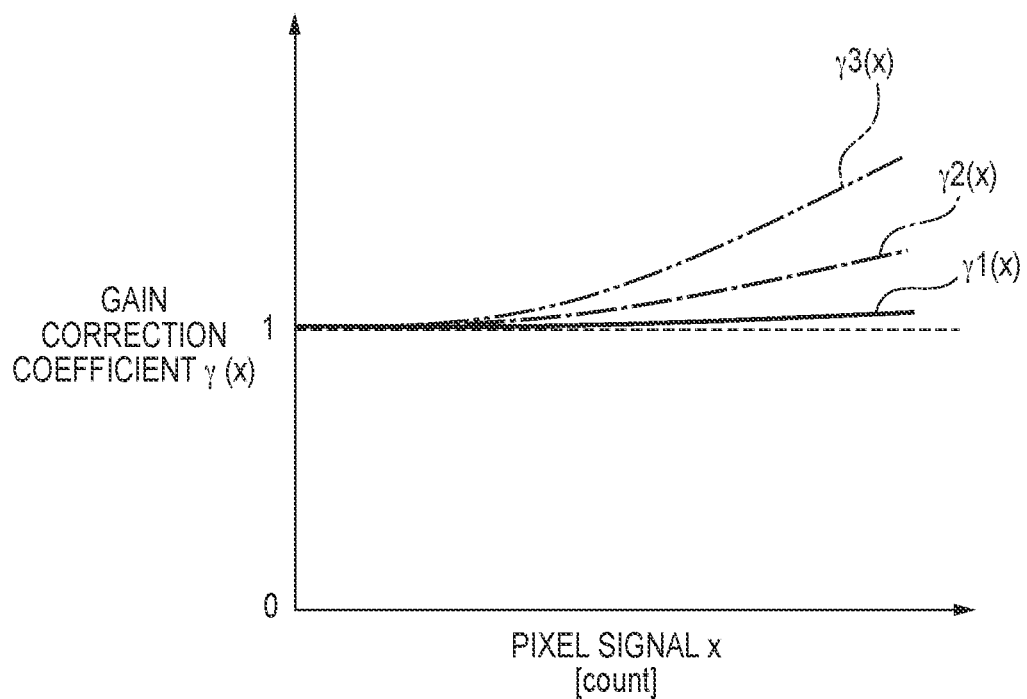
FIG. 14 is a diagram showing examples of gain correction coefficients according to the second embodiment.

A correction coefficient selection unit 1301 acquires the photometry result of the photometry performed by the photometry unit 109, and selects a gain correction coefficient corresponding to the pixel signal based on the photometry result. Specifically, one of the gain correction coefficients indicated by γ1(x) to γ3(x) in FIG. 14 is selected based on the maximum luminance value among the luminance values of subjects measured for respective photometry areas of the photometry unit 109. Here, x indicates a pixel signal input to a gain correction unit 1302, and γ1(x) to γ3(x) are gain correction coefficients corresponding to the pixel signal.

If the maximum luminance value measured by the photometry unit 109 is lower than a predetermined first threshold value, the gain correction coefficients γ1(x) are selected, and if the maximum luminance value is equal to or larger than a predetermined second threshold value, the gain correction coefficients γ3(x) are selected. Note that the first threshold value is smaller than the second threshold value. Further, in the case where the maximum luminance value is between the first and second thresholds, the gain correction coefficients γ2(x) are selected. That is, for the same pixel signals, as the maximum luminance value measured by the photometry unit 109 is higher, a gain correction coefficient whose gain correction amount is larger is selected. This is because the higher the maximum luminance value is, the greater the received light amount per unit time at the time of shooting increases, and the greater the influence of the drop of the pixel signal caused by the pulse signals from the light receiving unit being connected.

In the gain correction unit 1302, the pixel signal x is multiplied by the correction coefficient selected by the correction coefficient selection unit 1301 as in the following Equation (2).

$$y=\gamma(x)\times x \qquad (2)$$

Here, y is a pixel signal after the gain correction, and $\gamma(x)$ is a gain correction coefficient selected based on the photometry result and the pixel signal by the correction coefficient selection unit 1301.

Similarly to the first embodiment, the pixel signal undergone the gain correction by the gain correction unit 1302 is subjected to the offset correction by the black level correction unit 803, and the corrected pixel signal is output to the digital output unit.

Figure 15:
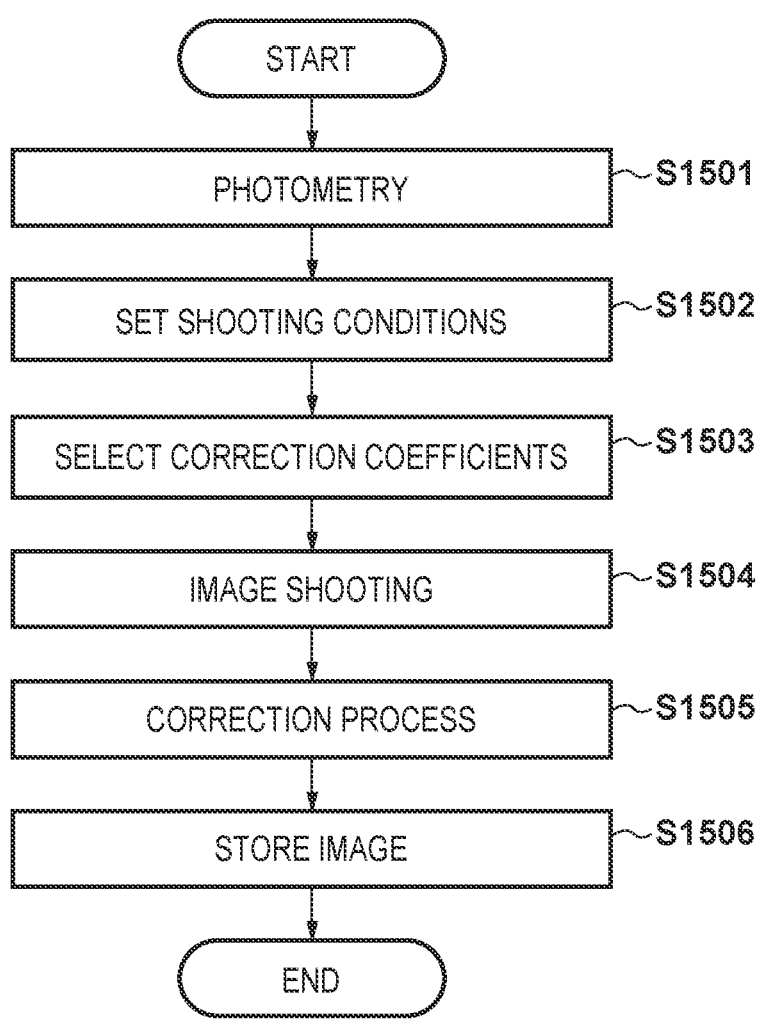
FIG. 15 is a flowchart of image shooting processing according to the second embodiment.

FIG. 15 shows a flowchart of automatic exposure image shooting processing in the second embodiment. When image shooting is started, in step S1501, photometry processing is performed in the photometry unit 109. Specifically, the luminance of a subject is measured for each photometry area of the photometry unit 109.

In step S1502, the overall control/arithmetic unit 104 sets the shooting conditions such as an aperture and an exposure period according to the photometry result of the photometry unit 109. Then, in step S1503, the correction coefficient selection unit 1301 selects the gain correction coefficients. Here, as described above with reference to FIG. 14, gain correction coefficients whose gain correction amount is larger as the maximum luminance value measured by the photometry unit 109 is higher is selected.

In step S1504, image shooting is performed by the image sensor 100 under the shooting conditions set in step S1502. Specifically, the driving shown in FIG. 7 is performed, and pixel signals are sequentially output from the pixel area 200 to the correction unit 207.

In step S1505, correction processes are performed on the pixel signals sequentially output from the pixel area 200 in the correction unit 207. In the gain correction unit 1302, among the gain correction coefficients selected by the correction coefficient selection unit 1301, the pixel signal is multiplied by a gain correction coefficient selected according to the pixel signal. Thus, it is possible to compensate for a decrease in pixel signal caused by pulse signals from the light receiving unit being connected. Thereafter, the pixel signals undergone the offset correction by the black level correction unit 803 are output from the image sensor 100, and stored as image data by the recording unit 107 in step S1506.

With the correction processes in the correction unit 207 as described above, it is possible to suppress image quality deterioration caused by a difference in received light amount per unit time.

Third Embodiment

Next, a third embodiment of the present invention will be described. In the third embodiment, a configuration for changing a correction amount of a black level correction unit based on a received light amount per unit time will be described.

In a pixel having a large received light amount per unit time, an avalanche multiplication phenomenon frequently occurs and a large current flows through the quenching resistor 304, so that more heat is generated at the quenching resistor 304. Accordingly, the temperature of the PD 303 in the vicinity of the quenching resistor 304 rises and the amount of dark current increases. As a result, a difference in dark current amount is caused between a pixel (OB pixel) in the OB region where light is not incident and a pixel whose received light amount per unit time is large. Therefore, in the third embodiment, a correction amount of a black level correction unit is changed according to a received light amount per unit time.

Figure 16:
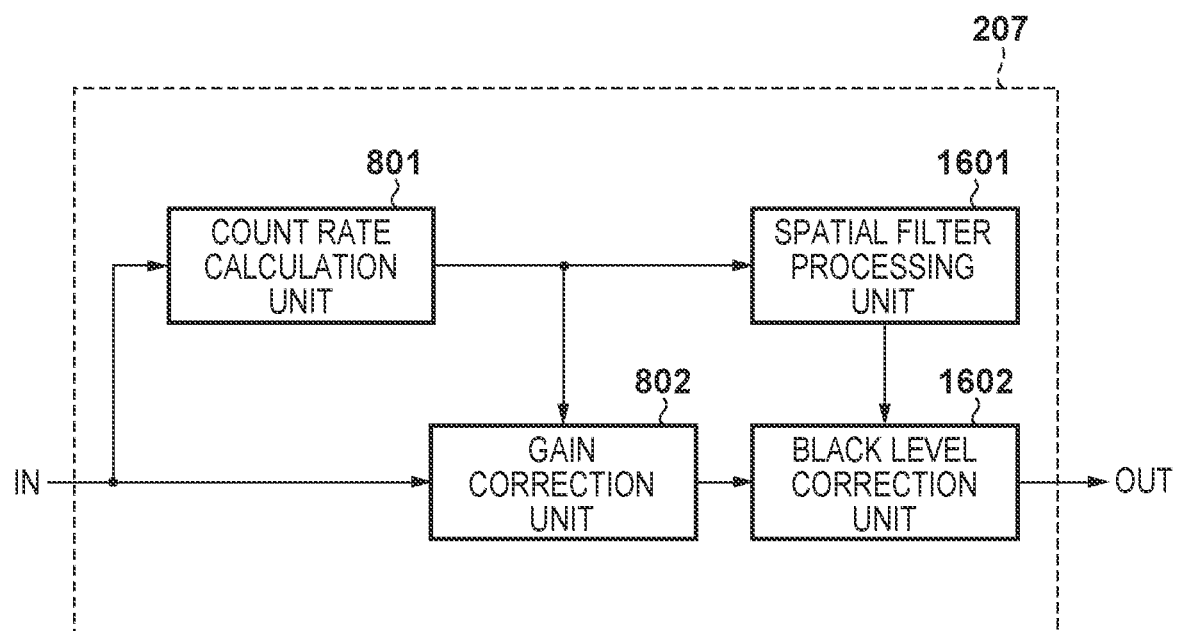
FIG. 16 is a block diagram illustrating a configuration of a correction unit according to a third embodiment.

FIG. 16 is a block diagram showing a configuration of the correction unit 207 in the third embodiment, which is used in place of the correction unit 207 shown in FIG. 8 described in the first embodiment. It is to be noted that the same reference numerals are given to the same configurations as those in FIG. 8, and a description thereof will be omitted. In addition, since the configuration other than the correction unit 207 is the same as that of the first embodiment described above, description thereof is omitted.

A spatial filter processing unit 1601 performs a filtering process on a count rate for each pixel calculated by the count rate calculation unit 801. For example, an average count rate which is the average value of the count rates of a target pixel and its surrounding eight pixels is calculated. As the filtering process, a weighted average process may be performed.

When the count rates of pixels to be read later than the target pixel is to be averaged, a holding memory (not shown) is provided before the correction unit 207 to temporarily hold the pixel signals and then filtering process may be performed by the spatial filter processing unit 1601. A pixel signal output from the gain correction unit 802 is input to a black level correction unit 1602, and offset correction represented by following Equation (3) is performed.

$$z=y-\beta(r_{ave})\times \text{drk} \qquad (3)$$

Here, z is a pixel signal after offset correction, y is a pixel signal input to the black level correction unit 1602, drk is an average pixel signal in the OB area, $r_{ave}$ is an average count rate calculated by the spatial filter processing unit 1601, and $\beta(r_{ave})$ is an offset correction coefficient, which is a value corresponding to the average count rate $r_{ave}$.

Figure 17A:
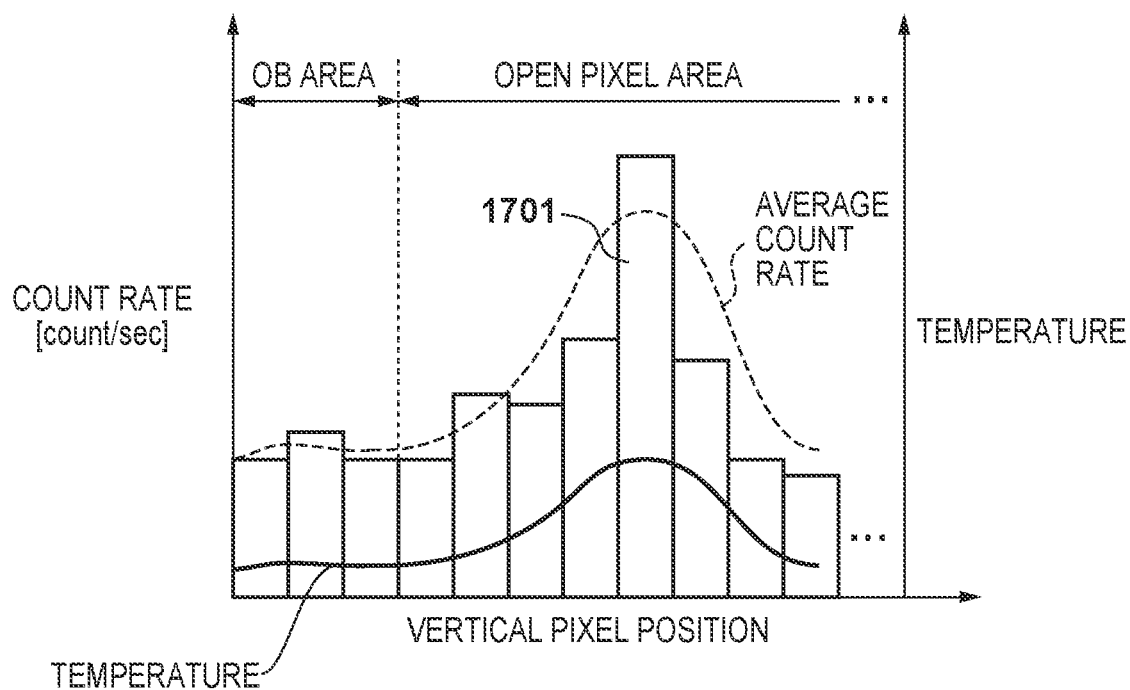
FIGS. 17A and 17B illustrate an offset correction method according to the third embodiment.

Details of the offset correction coefficient $\beta(r_{ave})$ will be described with reference to FIGS. 17A and 17B. FIG. 17A shows an example in which count rates of pixels in an arbitrary column in the pixel area are calculated. As shown in 1701, the count rate is high in a pixel whose received light amount per unit time is large. Further, in the vicinity of a pixel with a high count rate, the temperature increases due to the heat generated by the avalanche current as shown by the temperature indicated by the solid line. The average count rate indicated by a broken line is a value obtained by performing an averaging process on the count rate of each pixel by the spatial filter processing unit 1601.

Figure 17B:
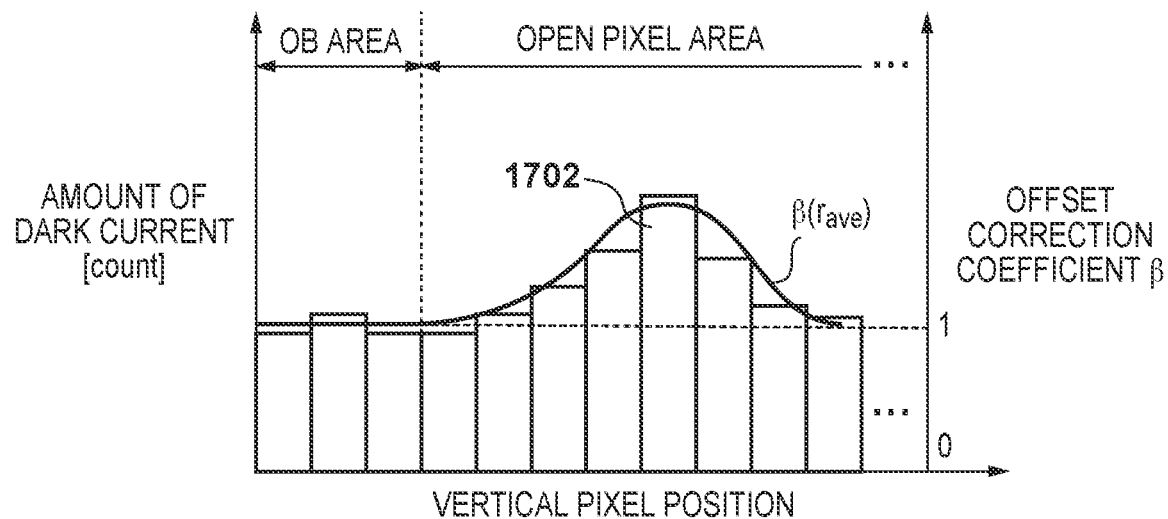

FIG. 17B is an example of the dark current amounts of the pixels corresponding to FIG. 17A. In the pixels near the position indicated by 1702, since the temperature is high, the amount of dark current is larger than in the pixels in the OB area. $\beta(r_{ave})$ shown by a solid line indicates offset correction coefficients for multiplying the average pixel signals of the OB area. As shown in FIG. 17B, the offset correction coefficient $\beta(r_{ave})$ has a larger value as the average count rate shown in FIG. 17A increases. In this manner, even if the amount of dark current differs between pixels in the OB area and pixels whose received light amounts per unit times are large, it is possible to appropriately remove the dark current component from the pixel signal.

In a case where the pixel area 200 is covered by a Bayer array color filter, the spatial filter processing unit 1601 may perform the averaging process separately for pixels of the same color. Further, an offset correction coefficient corresponding to the count rate calculated by the count rate calculation unit 801 may be used without providing the spatial filter processing unit 1601.

According to the third embodiment as described above, it is possible to appropriately eliminate the dark current component from the pixel signal of the pixel whose received light amount per unit time is large, and it is possible to suppress image quality deterioration caused by a difference in received light amount per unit time.

Fourth Embodiment

Next, a fourth embodiment of the present invention will be described. In the case of shooting images continuously, such as a case of shooting a moving image or the like, when a high luminance subject moves, a count rate of a pixel at the position where the subject was located decreases, and a decrease in temperature is much slower than the count rate. Accordingly, the dark current amount of each pixel gently changes in accordance with the change in temperature. In such a case as well, a configuration capable of suitably correcting the dark current component will be described.

Figure 18:
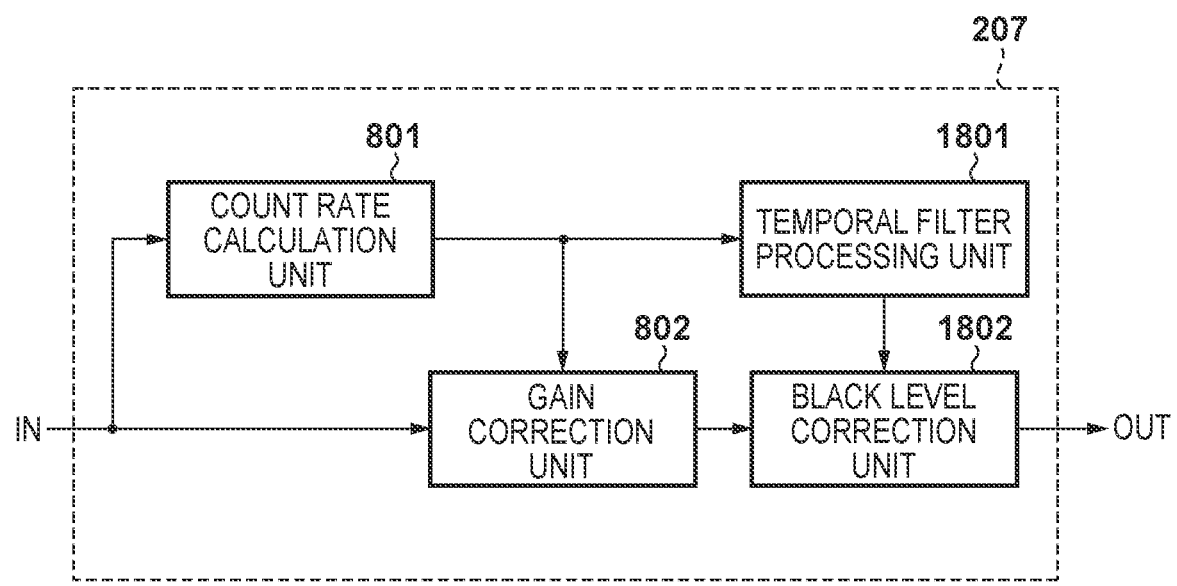
FIG. 18 is a block diagram illustrating a configuration of a correction unit according to a fourth embodiment.

FIG. 18 is a block diagram showing a configuration of the correction unit 207 in the fourth embodiment, which is used in place of the correction unit 207 shown in FIG. 8 described in the first embodiment. It is to be noted that the same reference numerals are given to the same configurations as those in FIG. 8, and a description thereof will be omitted. In addition, since the configuration other than the correction unit 207 is the same as that of the first embodiment described above, description thereof is omitted.

A temporal filter processing unit 1801 filters the count rate calculated by the count rate calculation unit 801 over a plurality of frames. For example, for each pixel, the average count rate of five latest frames including the current frame is calculated. In addition, the temporal filter processing unit 1801 includes a holding memory (not shown) for holding the average count rate of each pixel.

The pixel signal output from the gain correction unit 802 is input to a black level correction unit 1802, and the black level is corrected using the offset correction coefficient $\beta$ corresponding to the average count rate calculated by the temporal filter processing unit 1801. Since this correction method is the same as the method described with reference to the equation (3) in the third embodiment, explanation thereof is omitted.

Figure 19A:
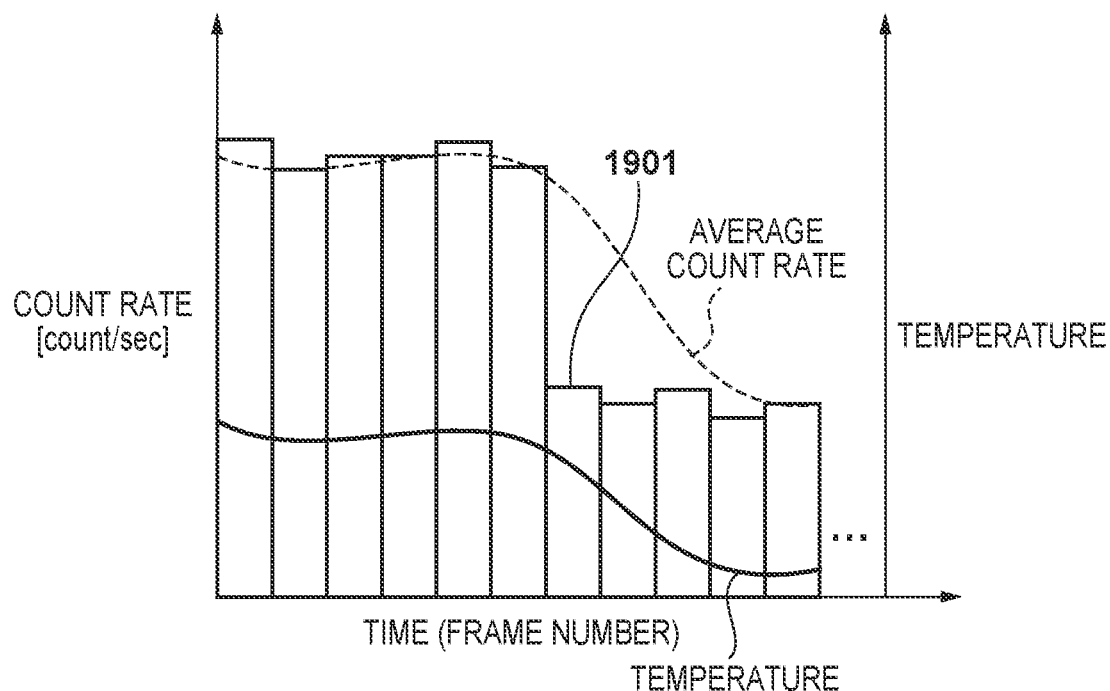
FIGS. 19A and 19B illustrate an offset correction method according to the fourth embodiment.
Figure 19B:
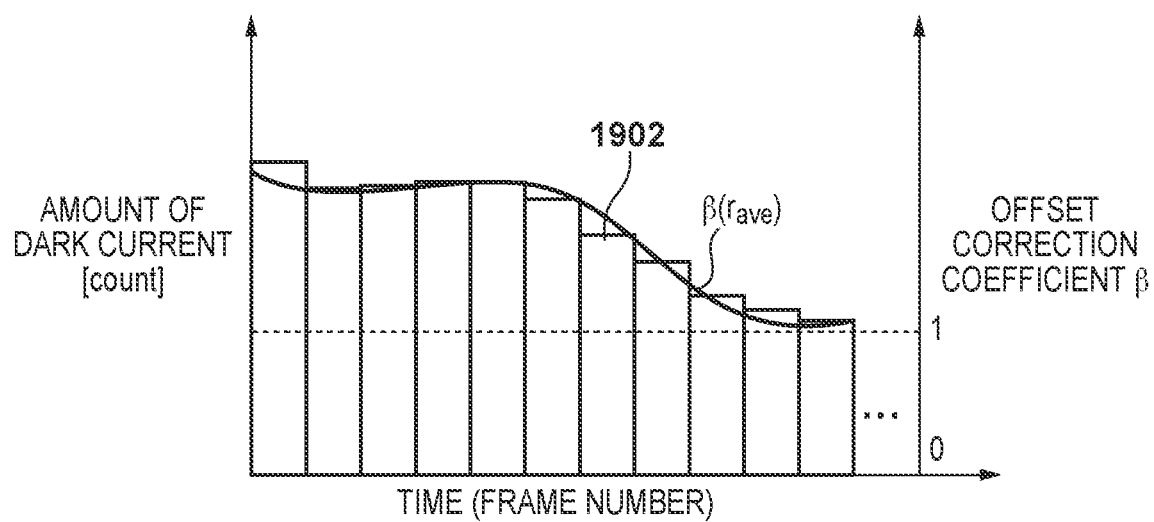

FIG. 19A shows an example in which a count rate of an arbitrary pixel in the pixel area is calculated for each frame. As shown in a frame 1901, even when the count rate of the target pixel is lowered due to the movement of the high luminance subject, for example, the temperature of the target pixel indicated by the solid line in the figure does not decrease immediately but decreases gently. Therefore, as shown in FIG. 19B, the dark current of each frame gradually changes according to the temperature. The average count rate indicated by a broken line is a value obtained by averaging the count rates of the target pixel over plural frames by the temporal filter processing unit 1801.

FIG. 19B is an example of the dark current amount over frames corresponding to FIG. 19A. In the frame 1902, although the count rate has decreased, since the temperature of the pixel is still high, the dark current amount remains high comparing to the count rate. $\beta(r_{ave})$ indicated by the solid line is an offset correction coefficient for multiplying the average pixel signal of the OB area in Equation (3). The offset correction coefficient $\beta(r_{ave})$ for a pixel has a larger value as the average count rate of the pixel shown in FIG. 17A is higher. By performing offset correction by using the value obtained by multiplying the average pixel signal of the OB area by the offset correction coefficient, it is possible to remove the dark current component from the pixel signal.

According to the fourth embodiment as described above, it is possible to appropriately eliminate the dark current component from a pixel signal even if a received light amount per unit time has largely changed during shooting a moving image or the like.

Fifth Embodiment

Next, a fifth embodiment of the present invention will be described. In the first embodiment as described above, since the count rate is calculated based on pixel signals output after the end of the exposure period and correction is performed, in a case where luminance of a subject changes during the exposure period, it is not possible to obtain a correct count rate. In consideration of the above defect, in the fifth embodiment, a configuration capable of handling a case where luminance of a subject changes during the exposure period will be described.

Figure 20:
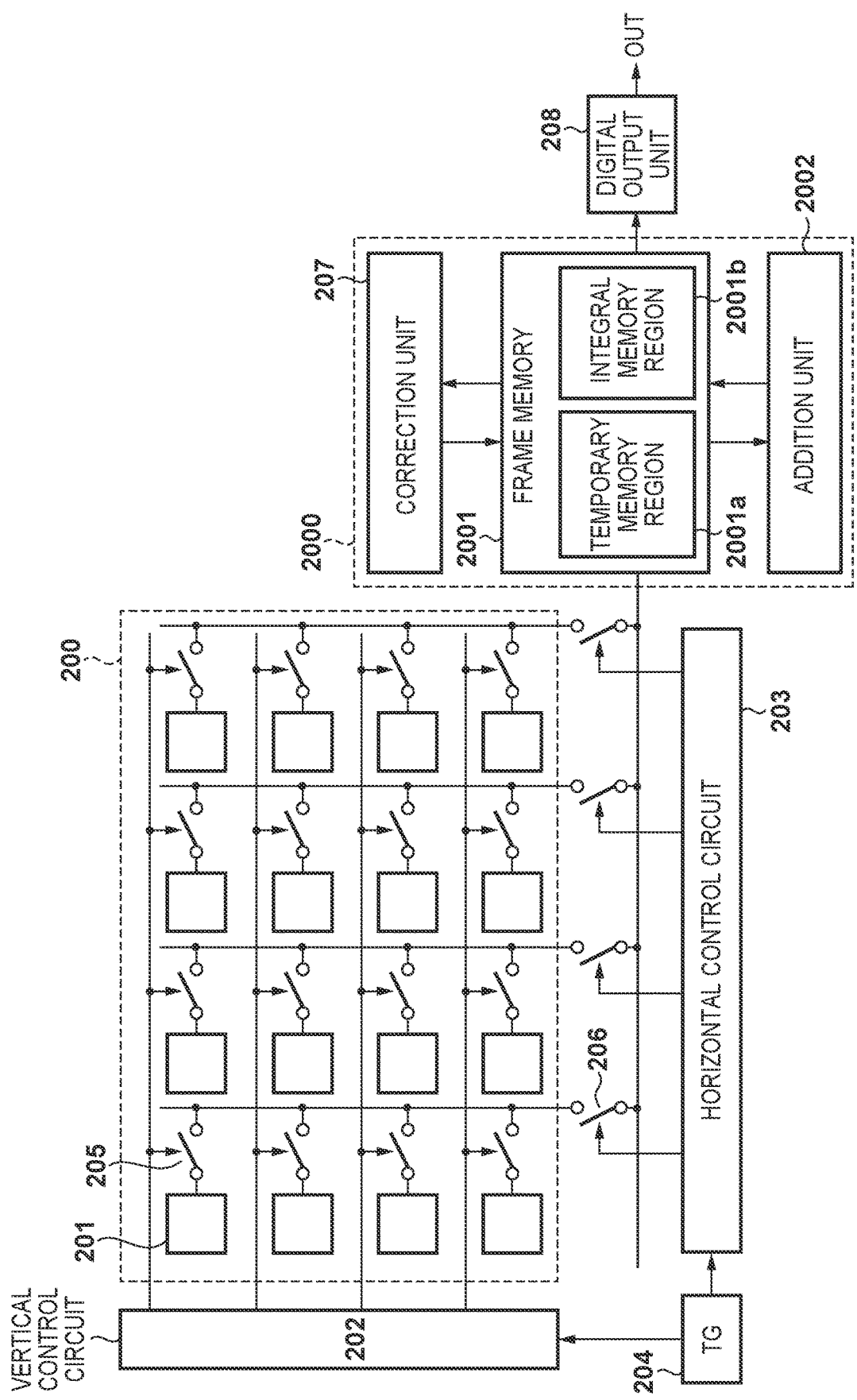
FIG. 20 is a diagram showing a configuration of an image sensor according to a fifth embodiment.

FIG. 20 is a diagram showing the entire configuration of an image sensor 100' in the fifth embodiment, which is used in place of the image sensor 100 shown in FIG. 2 described in the first embodiment. It is to be noted that the same reference numerals are given to the same configurations as those in FIG. 2, and a description thereof will be omitted. Further, since the configuration other than the image sensor 100' is the same as that of the first embodiment described above, description thereof is omitted.

A signal processing block 2000 includes a correction unit 207, a frame memory 2001, and an addition unit 2002. The frame memory 2001 is a storage circuit which includes a temporary memory region 2001a and an integral memory region 2001b and acquires and holds digital pixel signals from each pixel during the exposure period. The temporary memory area 2001a acquires digital pixel signals from respective pixels and temporarily holds them. The pixel signals held in the temporary memory area 2001a are input to the correction unit 207, and the same correction processes as those in the first embodiment is performed.

The addition unit 2002 adds the image signal newly read out from each pixel and corrected to the image signal held in the integral memory region 2001b for each identical address. The added image signal is held again in the integral memory region 2001b. As a result, the integral memory region 2001b holds the pixel signal obtained by integrating pixel signals corrected by the correction unit 207 for each identical address during the exposure period. Here, the temporary memory region 2001a has the same bit width per pixel as the digital pixel signal output from the unit pixel 201. On the other hand, the integral memory region 2001b has a sufficiently large bit width per pixel as compared with the digital pixel signal output from the unit pixel 201.

The pixel signal held in the integral memory region 2001b is output to the outside of the image sensor 100 via the digital output unit 208 after the end of the exposure period. Note that the frame memory 2001, the addition unit 2002, and the correction unit 207 may be provided outside the image sensor 100'.

Figure 21:
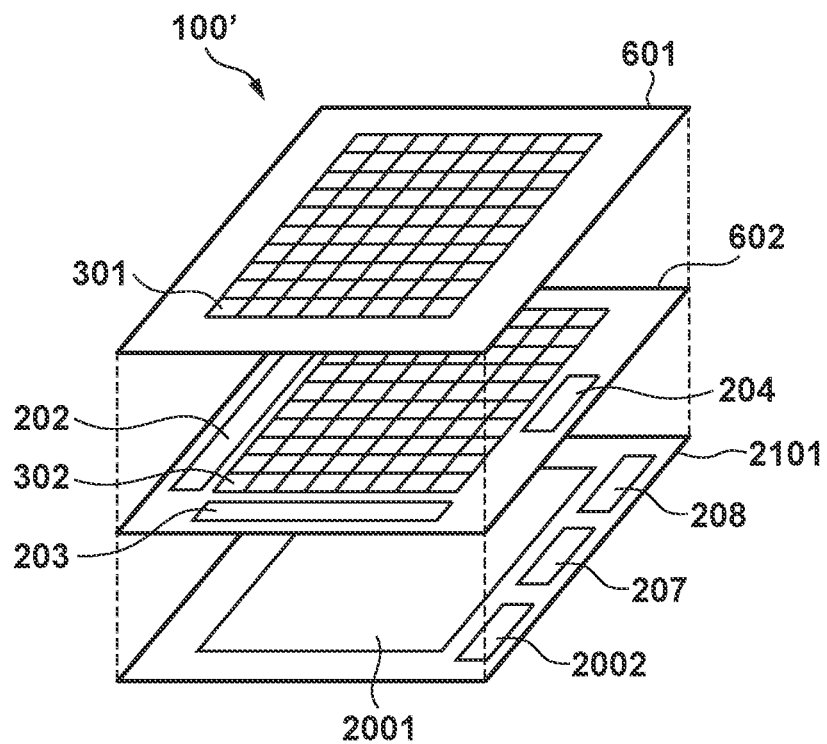
FIG. 21 is a schematic diagram showing an example of a chip layout of the image sensor according to the fifth embodiment.

FIG. 21 shows an example of a chip layout of the image sensor 100' in the fifth embodiment. FIG. 21 corresponds to FIG. 6 of the first embodiment, and the same components as those in FIG. 6 are denoted by the same reference numerals, and description thereof will be omitted.

The image sensor 100' has a structure in which a light receiving unit substrate 601, a counting unit substrate 602, and a frame memory substrate 2101 are stacked. Wirings of these substrates are electrically connected by using silicon penetrating electrodes or the like. On the frame memory substrate 2101, the frame memory 2001, the addition unit 2002, the correction unit 207, and the digital output unit 208 are arranged. If the frame memory substrate 2101 is manufactured with a finer process than the light receiving unit substrate 601 and the counting unit substrate 602, the frame memory 2001 can secure a large number of bits. It should be noted that the image sensor 100' may be formed on a single substrate instead of forming on the stacked substrates.

Figure 22:
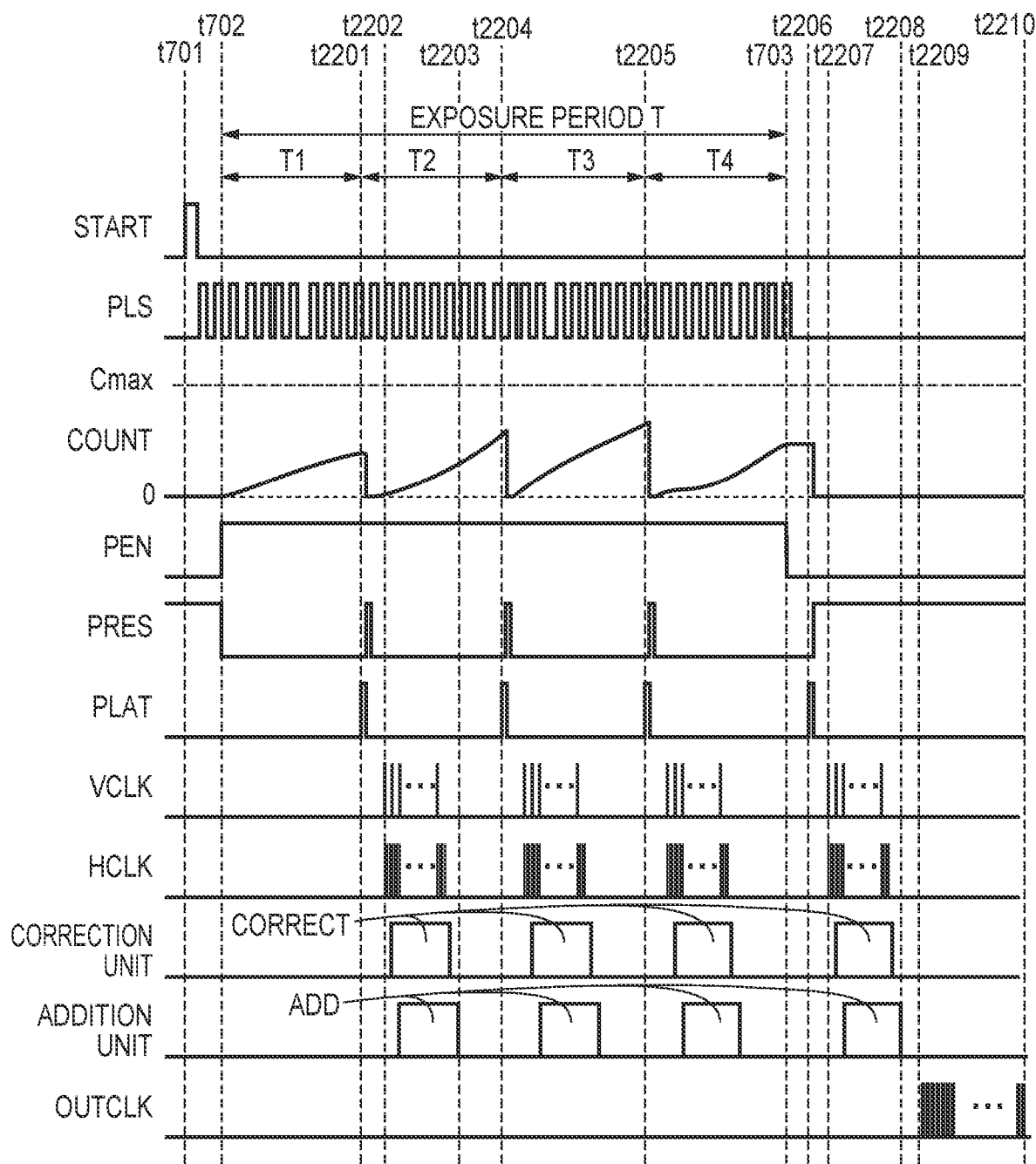
FIG. 22 is a drive timing chart of the image capturing apparatus when an image of one frame is captured according to the fifth embodiment.

FIG. 22 is a drive timing chart of the image capturing apparatus when obtaining an image of one frame in the fifth embodiment. FIG. 22 corresponds to the timing chart shown in FIG. 7 of the first embodiment, and processes that perform the same operations as those in FIG. 7 are denoted by the same reference numerals, and the description thereof will be omitted as appropriate.

In FIG. 22, the exposure period T between time t702 and time t703 is divided into four exposure periods (hereinafter referred to as "divided exposure periods") T1 to T4, and a pixel signal is transferred from each pixel to the frame memory 2001 for each divided exposure period.

When the divided exposure period T1 elapses at time t2201, the PLAT signals supplied to all the pixels from the vertical control circuit 202 simultaneously change from L to H to L. As a result, the count value counted by the counter circuit 306 of each pixel during the divided exposure period T1 is held in the pixel memory 307 of each pixel as a pixel signal. When the pixel signal is held in the pixel memory 307, the PRES signal goes high immediately and the count value of the counter circuit 306 of each pixel is reset to 0. When the PRES signal returns to L, the resetting of the counter circuit 306 end, and the counter circuit 306 of each pixel starts counting according to the incident photons again.

From time t2202 to time t2203, the VCLK signal and the HCLK signal are supplied from the TG 204 to the vertical control circuit 202 and the horizontal control circuit 203, respectively. The pixels are sequentially selected by the vertical control circuit 202 and the horizontal control circuit 203, and the pixel signals held in the pixel memories 307 are sequentially held in the temporary memory region 2001a in the frame memory 2001. Gain correction and offset correction are performed on the pixel signals held in the temporary memory region 2001a in the correction unit 207, and the corrected pixel signals are held in the temporary memory region 2001a again. The correction processes performed by the correction unit 207 here is the same as those of the first to fourth embodiments, and the explanation thereof is omitted.

Then, in the addition unit 2002, the corrected pixel signal held in the temporary memory region 2001a and the pixel signal of the same address held in the integral memory region 2001b are added, and the added pixel signal is again stored in the integral memory region 2001b. The correction processes and the addition process are performed in parallel with the operation of transferring the pixel signals in the pixel memories 307 of the respective pixels to the frame memory 2001.

In the first addition process performed from time t2202 to time t2204, since pixel signals are not held in the integral memory region 2001b in the frame memory 2001, the pixel signals corrected by the correction unit 207 are directly input to the integral memory region 2001b.

When the divided exposure period T2 elapses at time t2204, the PLAT signal again changes from L to H to L so that the pixel signal of each pixel is held in the temporary memory region 2001a of the frame memory 2001, and undergoes correction processes and addition process in the same manner as in the period from time t2201 to time t2203. Then, the pixel signal which has undergone the addition process is held again in the integral memory region 2001b. Thereafter, the same processes are repeated each time the divided exposure period elapses.

Here, it is necessary to complete transferring of the pixel signal held in the pixel memory 307 of each pixel to the temporary memory region 2001a, the correction processes in the correction unit 207, and the addition process in the addition unit 2002, performed from time t2201 to time t2203, by time t2204. In other words, these processes needs to be completed before the next divided exposure period elapses. Therefore, an operation frequency at which processes are completed within this period is set. Alternatively, the length and/or the number of division of the divided exposure periods are adjusted so that the processes are completed before the next divided exposure period elapses.

At time t703, when the exposure period T for one frame ends, the PEN signal becomes L. As a result, the counter circuit 306 of each pixel is disabled, and the count value of the counter circuit 306 does not increase. Also, the supply of the reverse bias voltage Vbias to the light receiving unit 301 is stopped, and the light receiving unit 301 stops outputting the PLS signal. Then, at time t2206, the PLAT signal switches from L to H to L, and the count value counted by the counter circuit 306 at the end of the exposure period is held in the pixel memory 307. Then, the PRES signal becomes H, and the count value of the counter circuit 306 is reset to 0.

Thereafter, from time t2207 to time t2208, the pixel signal of each pixel is transferred to the temporary memory region 2001a, as in the period from time t2202 to time t2203. Then, the pixel signals undergone the correction processes and the addition process are held in the integral memory region 2001b. At this time, the pixel signals held in the integral memory region 2001b are signals obtained by integrating the pixel signals acquired from the pixel memories 307 during the exposure period from time t702 to time t703. Each of the pixel signals is a signal corresponding to the number of photons incident during the exposure period.

According to the fifth embodiment as described above, the count rate is calculated and corrected for each divided exposure period. By doing so, compared with the first embodiment, even when the luminance of a subject changes during the exposure period, it is possible to suitably suppress image quality deterioration caused by a difference in received light amount per unit time. It should be noted that the number of division of the exposure period and the length of the divided exposure period in the above fifth embodiment are merely examples, and the present invention is not limited thereto.

Sixth Embodiment

Next, a sixth embodiment of the present invention will be described. In the fifth embodiment described above, the count value of the counter circuit is reset every time the pixel signal is read out to the frame memory 2001 during the exposure period. In the sixth embodiment, a configuration in which the count value of the counter circuit is not reset during the exposure period will be described. The configuration in the sixth embodiment can cope with a case where the subject luminance changes during the exposure period, as in the case of the fifth embodiment.

Figure 23:
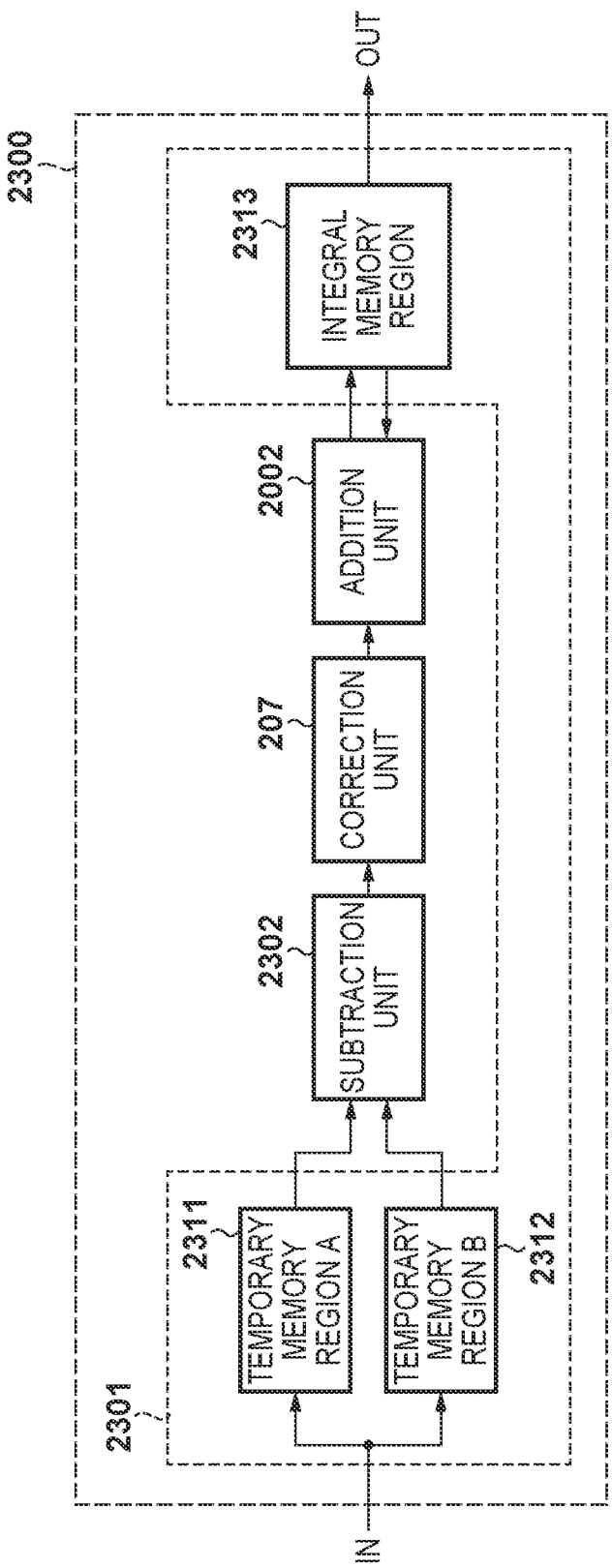
FIG. 23 is a block diagram showing a configuration of a signal processing block according to a sixth embodiment.

FIG. 23 shows a configuration of a signal processing block 2300 that performs signal processing on pixel signals output from the pixel area 200. The signal processing block 2300 is used in place of the signal processing block 2000 shown in FIG. 20 described in the fifth embodiment. Since other parts are the same as those in the fifth embodiment, the description thereof will be omitted.

A frame memory 2301 is a storage circuit that acquires and holds a digital pixel signal from each pixel during the exposure period, and is composed of a temporary memory region A 2311, a temporary memory region B 2312, and an integral memory region 2313. The temporary memory region A 2311 and the temporary memory region B 2312 are temporary memories for temporarily holding a digital pixel signal from each pixel. Every time a reading operation of each pixel is performed during the exposure period, the read pixel signal is held in the temporary memory region A 2311 or the temporary memory region B 2312 alternately. The integral memory region 2313 holds a value obtained by integrating the pixel signals corrected by the correction unit 207 during the exposure period.

A subtraction unit 2302 calculates differences between the pixel signals held in the temporary memory region A 2311 and the pixel signals held in the temporary memory region B 2312 for each address, and outputs difference signals (difference values) to the correction unit 207. Since the correction processes of the correction unit 207 are the same as those described in the first to fourth embodiments, the description thereof will be omitted here. The addition unit 2002 adds the image signal corrected by the correction unit 207 to the image signal held in the integral memory region 2313 of the frame memory 2301 for each address. The added image signal is stored again in the integral memory region 2313. The pixel signal held in the integral memory region 2313 is output to the outside of the image sensor 100' via the digital output unit 208 after the exposure period has elapsed. Note that the signal processing block 2300 may be provided outside the image sensor 100'.

Figure 24:
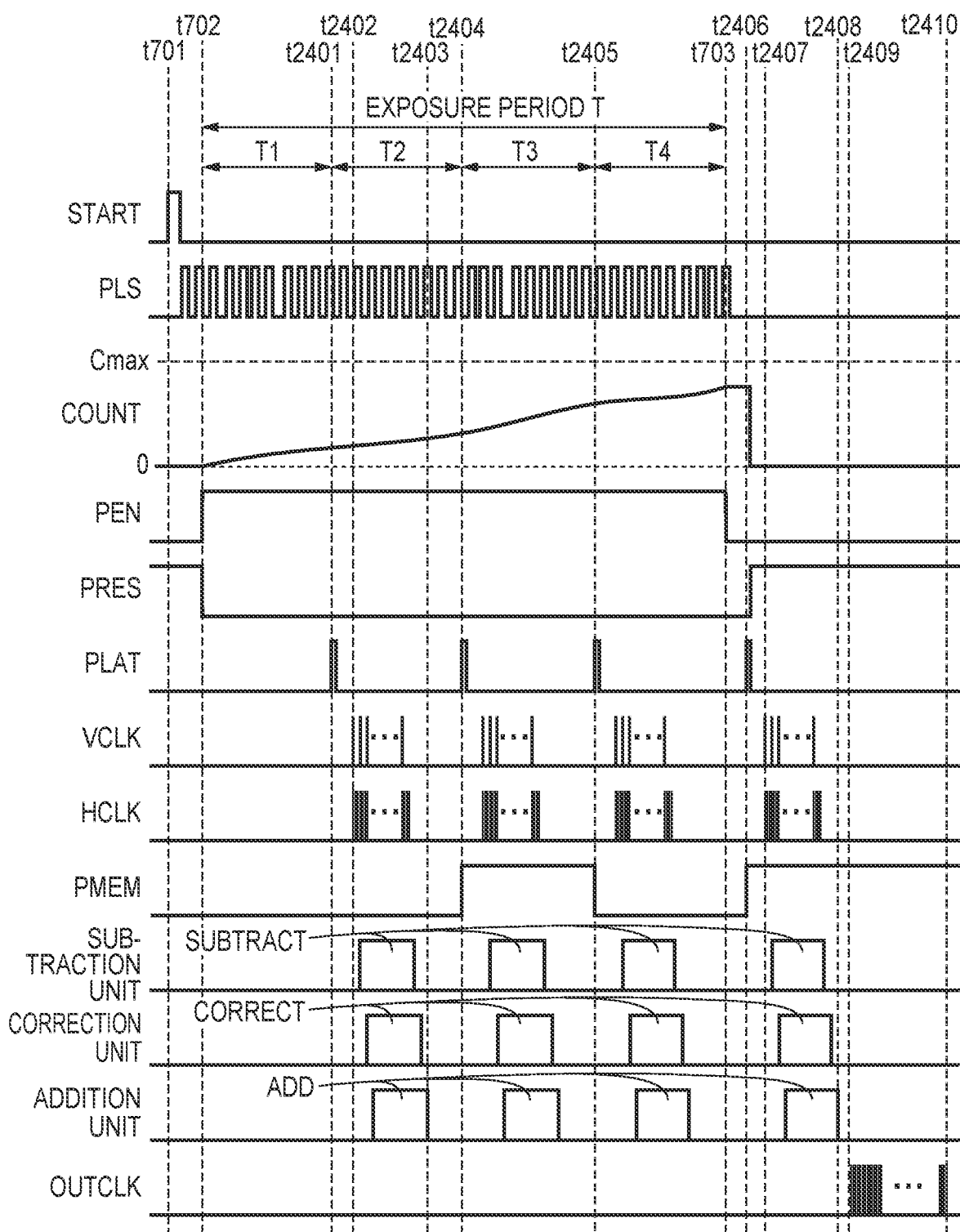
FIG. 24 is a drive timing chart of the image capturing apparatus when an image of one frame is captured according to the sixth embodiment.

FIG. 24 shows a drive timing chart of the image capturing apparatus when obtaining an image of one frame in the sixth embodiment. FIG. 24 corresponds to the timing chart shown in FIG. 22 of the fifth embodiment, and processes that perform the same operations as those in FIG. 22 are denoted by the same reference numerals, and description thereof will be omitted as appropriate.

In FIG. 24, as in the fifth embodiment, the exposure period T from time t702 to time t703 is divided into four divided exposure periods T1 to T4, and a pixel signal is read from each pixel to the frame memory 2301 for each divided exposure period. However, unlike the fifth embodiment, the count value of the counter circuit 306 is not reset after reading the pixel signal to the frame memory 2301.

When the divided exposure period T1 elapses at time t2401, the PLAT signals supplied to all the pixels from the vertical control circuit 202 simultaneously change from L to H to L. As a result, the count value counted by the counter circuit 306 of each pixel during the divided exposure period T1 is held in the pixel memory 307 of each pixel as a pixel signal. From time t2402 to t2403, the VCLK signal and the HCLK signal are supplied from the TG 204 to the vertical control circuit 202 and the horizontal control circuit 203, respectively. The pixels are sequentially selected by the vertical control circuit 202 and the horizontal control circuit 203, and the pixel signals held in the pixel memories 307 are sequentially held in the temporary memory region in the frame memory 2001.

The PMEM signal is a control signal for selecting which of the temporary memory region A 2311 and the temporary memory region B 2312 the pixel signal is to be held, and is sent from the TG 204 to the frame memory 2301. When the PMEM signal is at the L level, the pixel signal output from the pixel area 200 is held in the temporary memory region A 2311 and is held in the temporary memory region B 2312 when the PMEM signal is at the H level. In the period from time t2402 to time t2403, since the PMEM signal is at the L level, the pixel signals output from the pixel area 200 are held in the temporary memory region A 2311.

When the pixel signals are held in the temporary memory region A 2311, the subtraction unit 2302 subtracts the pixel signals held in the temporary memory region B 2312 from the pixel signals held in the temporary memory region A 2311 for each address to generate difference signals. Then, the difference signals are output to the correction unit 207. At this time, since no pixel signal is held in the temporary memory region B 2312, the pixel signals held in the temporary memory region A 2311 are outputted to the correction unit 207. Here, the difference signals output to the correction unit 207 are signals counted by the counter circuits 306 during the divided exposure period T1. After the gain correction and the offset correction are performed on the pixel signals input to the correction unit 207, the addition unit 2002 adds the pixel signals after the correction processes and the pixel signals held in the integral memory region 2313 for each address. Then, the added pixel signals are held again in the integral memory region 2313. The above difference process, correction processes and addition process are performed in parallel with the operation of transferring the pixel signal of each pixel to the temporary memory region A 2311 of the frame memory 2301. In addition, in the first addition process performed from time t2402 to time t2404, since pixel signals are not held in the integral memory region 2313, the pixel signals corrected by the correction unit 207 are directly stored in the integral memory region 2313.

Since the counter circuits 306 are not reset after holding the count values of the counter circuits 306 in the pixel memories 307 at time t2401, the count value continues to increase according to the number of incident photons.

When the divided exposure period T2 elapses at time t2404, the PLAT signal again changes from L to H to L so that the pixel signal of each pixel is output to the frame memory 2301 and held there, as in the period from time t2401 to time t2403. At this time, since the PMEM signal becomes H, the pixel signal of each pixel is held in the temporary memory region B 2312. The subtraction unit 2302 subtracts the pixel signals held in the temporary memory region A 2311 during time t2402 and time t2403 from the pixel signals held in the temporary memory region B 2312 for each address, and outputs the difference signals to the correction unit 207. Here, the subtraction process performed by the subtraction unit 2302 is to subtract the previously held signals from the newly held signals between the signals held in the temporary memory region A 2311 and the temporary memory region B 2312. Therefore, the difference signals generated by this subtraction process are signals corresponding to the numbers of photons incident during the divided exposure period T2. The difference signals obtained by subtraction unit 2302 undergo the correction processes and the addition process by the correction unit 207 and the addition unit 2002. Then, the pixel signals undergone the addition process is stored again in the integral memory region 2313. After that, the same processes are repeated for each divided exposure period.

When the exposure period T ends at time t703, the PEN signal becomes L. As a result, the counter circuit 306 of each unit pixel 201 is disabled, and even if the PLS signal is input to the counter circuit 306, the count value does not increase. Also, the supply of the reverse bias voltage Vbias to the light receiving unit 301 is stopped, and the light receiving unit 301 stops outputting the PLS signal.

Then, at time t2406, the PLAT signal switches from L to H to L, and the count value counted by the counter circuit 306 at the end of the exposure period is held in the pixel memory 307. Then, the PRES signal becomes H, and the count value of the counter circuit 306 is reset to 0.

Thereafter, from time t2407 to time t2408, the pixel signal of each pixel is transferred to either of the temporary memory region A 2311 or the temporary memory region B 2312, as in the period from time t2402 to time t2403. Then, the pixel signals undergone the subtraction process, the correction processes and the addition process are held in the integral memory region 2313. At this time, the pixel signals held in the integral memory region 2313 are signals obtained by integrating the pixel signals acquired from the pixel memories 307 during the exposure period from time t702 to time t703. Each of the pixel signals is a signal corresponding to the number of photons incident during the exposure period.

According to the sixth embodiment as described above, the count rate is calculated and corrected for each divided exposure period. By doing so, compared with the first embodiment, even when the luminance of a subject changes during the exposure period, it is possible to suitably suppress image quality deterioration caused by a difference in received light amount per unit time. It should be noted that the number of division of the exposure period and the length of the divided exposure period are merely examples, and the present invention is not limited thereto.

Although the embodiments of the present invention have been described above, the present invention is not limited to these embodiments. Further, the above-described embodiments may be appropriately combined.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-241119, filed on Dec. 15, 2017, which is hereby incorporated by reference herein in its entirety.

What is claimed is:

1. An image sensor comprising one or more processors and/or circuitry which functions as:
   a plurality of pixels each of which detects photons incident during a predetermined exposure period, counts a number of the photons, and outputs a first count value;
   a receiver that receives a photometry result of luminance of a subject measured by a photometer provided outside of the image sensor;
   a corrector that acquires a correction coefficient based on the photometry result received by the receiver and the first count value and corrects a detection error of the first count value using the correction coefficient,
   wherein the corrector acquires a larger value as the correction coefficient in a case where a luminance value based on the photometry result is a first luminance value than in a case where the luminance value is a second luminance value which is smaller than the first luminance value.

2. The image sensor according to claim 1, wherein each of the plurality of pixels has a detector that detects photons, a counter that counts a number of the detected photons and outputs a counted value, and a memory that holds the counted value, and
   the counted value held in the memory is output as the first count value.

3. The image sensor according to claim 2, further comprising one or more processors and/or circuitry which functions as an adder that, for a predetermined number of consecutive exposure periods, adds the first count values each of which is output each time the exposure period elapses and is corrected by the corrector pixel by pixel,
   wherein the counter resets the counted value each time the counted value is held in the memory.

4. The image sensor according to claim 2, wherein the detector includes an avalanche photodiode and a quenching resistor for applying a reverse bias voltage across the avalanche photodiode.

5. The image sensor according to claim 2, wherein the detector includes an avalanche photodiode and a MOS transistor for applying a reverse bias voltage across the avalanche photodiode.

6. The image sensor according to claim 2, wherein the image sensor has a stacked structure, and the detector and the counter are formed on different layers.

7. The image sensor according to claim 1, wherein the correction coefficient is a value based on a difference between the second count value and a value per unit time of an ideal count value in a case where no detection error occurs.

8. The image sensor according to claim 1, further comprising one or more processors and/or circuitry which functions as a second memory that stores correction coefficients corresponding to different counted values per unit time,
wherein the corrector selects the correction coefficient corresponding to the second count value from the correction coefficients stored in the second memory.

9. The image sensor according to claim 1, wherein the corrector obtains the correction coefficient corresponding to the second count value using an approximation function for obtaining a correction coefficient corresponding to the counted value per unit time.

10. The image sensor according to claim 1, wherein a part of the plurality of pixels are optical black pixels which are shielded from light, and
the image sensor further comprises a black level corrector that corrects the first count value output from a pixel which is not shielded from light and corrected by the corrector by using a value obtained by acquiring a second correction coefficient for correcting a black level based on the second count value of the pixel which is not shielded from light and corrects an average value of the first count values output from the optical black pixels and corrected by the corrector using the second correction coefficient.

11. The image sensor according to claim 10, wherein the black level corrector acquires the second correction coefficient based on an average of the second count values of a pixel to be corrected and its surrounding pixels.

12. The image sensor according to claim 10, wherein the black level corrector acquires the second correction coefficient based on an average of the second count values of a pixel to be corrected respectively obtained in a predetermined number of consecutive exposure periods.

13. An image capturing apparatus comprising one or more processors and/or circuitry which functions as:
a photometer that measures luminance of a subject; and
an image sensor including:
a plurality of pixels each of which detects photons incident during a predetermined exposure period, counts a number of the photons, and outputs a first count value;
a receiver that receives a photometry result of the luminance of the subject measured by the photometer; and
a corrector that acquires a correction coefficient based on the photometry result received by the receiver and the first count value and corrects a detection error of the first count value using the correction coefficient,
wherein the corrector acquires a larger value as the correction coefficient in a case where a luminance value based on the photometry result is a first luminance value than in a case where the luminance value is a second luminance value which is smaller than the first luminance value.

14. The image capturing apparatus according to claim 13, wherein each of the plurality of pixels has a detector that detects photons, a counter that counts a number of the detected photons and outputs a counted value, and a memory that holds the counted value, and
the image capturing apparatus further comprises one or more processors and/or circuitry which functions as an adder that, for a predetermined number of consecutive exposure periods, adds the first count values each of which is output each time the exposure period elapses and is corrected by the corrector pixel by pixel,
wherein the counter resets the counted value each time the counted value is held in the memory.

15. The image capturing apparatus according to claim 13, wherein a part of the plurality of pixels are optical black pixels which are shielded from light, and
the image capturing apparatus further comprises one or more processors and/or circuitry which functions as a black level corrector that corrects the first count value output from a pixel which is not shielded from light and corrected by the corrector by using a value obtained by acquiring a second correction coefficient for correcting a black level based on the second count value of the pixel which is not shielded from light and correcting an average value of the first count values output from the optical black pixels and corrected by the corrector using the second correction coefficient.

* * * * *